(12) United States Patent
You et al.

(10) Patent No.: US 10,020,205 B2
(45) Date of Patent: Jul. 10, 2018

(54) TRANSPARENT DISPLAY APPARATUS

(71) Applicant: SAMSUNG DISPLAY CO., LTD., Yongin-si, Gyeonggi-Do (KR)

(72) Inventors: Chungi You, Yongin-si (KR); Gwanggeun Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/053,918

(22) Filed: Feb. 25, 2016

(65) Prior Publication Data

US 2017/0005155 A1    Jan. 5, 2017

(30) Foreign Application Priority Data

Jul. 3, 2015   (KR) ......................... 10-2015-0095196

(51) Int. Cl.
| | |
|---|---|
| *H01L 29/66* | (2006.01) |
| *H01L 21/56* | (2006.01) |
| *H01L 27/32* | (2006.01) |
| *H01L 29/786* | (2006.01) |
| *H01L 29/417* | (2006.01) |
| *H01L 29/167* | (2006.01) |

(Continued)

(52) U.S. Cl.
CPC ........ *H01L 21/56* (2013.01); *H01L 21/31111* (2013.01); *H01L 21/32133* (2013.01); *H01L 27/326* (2013.01); *H01L 27/3258* (2013.01); *H01L 29/167* (2013.01); *H01L 29/41733* (2013.01); *H01L 29/66757* (2013.01); *H01L 29/7866* (2013.01)

(58) Field of Classification Search
None
See application file for complete search history.

(56) References Cited

U.S. PATENT DOCUMENTS

2007/0170431 A1*  7/2007  Choi ................. G02F 1/136227
                                                     257/66
2011/0169720 A1*  7/2011  Hwang .............. H01L 27/3258
                                                     345/76

(Continued)

FOREIGN PATENT DOCUMENTS

KR      1020100012287     2/2010
KR      10-2012-0019026   3/2012

(Continued)

*Primary Examiner* — Reema Patel
*Assistant Examiner* — Steven Christopher
(74) *Attorney, Agent, or Firm* — F. Chau & Associates, LLC

(57) ABSTRACT

A display apparatus includes a pixel having a first area emitting light and a second area transmitting light. A pixel circuit unit is in the first area and includes a thin film transistor. An inorganic insulation layer is in the second area. A first insulation layer covers the pixel circuit unit in the first area, and has an opening exposing the inorganic insulation layer in the second area. A first electrode is on the first insulation layer in the first area. The first electrode is electrically connected to the pixel circuit unit. A second insulation layer covers edges of the first electrode and is outside the opening formed in the first insulation layer. A second electrode is in the first area. An intermediate layer, including an emissive layer, is between the first electrode and the second electrode.

23 Claims, 25 Drawing Sheets

(51) Int. Cl.
*H01L 21/311* (2006.01)
*H01L 21/3213* (2006.01)

(56) References Cited

U.S. PATENT DOCUMENTS

| | | |
|---|---|---|
| 2012/0049215 A1 | 3/2012 | Yoon et al. |
| 2012/0169217 A1 | 7/2012 | Kim et al. |
| 2013/0328022 A1 | 12/2013 | Choi et al. |
| 2014/0234775 A1 | 8/2014 | Park et al. |

FOREIGN PATENT DOCUMENTS

| | | |
|---|---|---|
| KR | 10-2012-0078954 | 7/2012 |
| KR | 10-2013-0035779 | 4/2013 |
| KR | 1020130061471 | 6/2013 |
| KR | 10-2013-0138883 | 12/2013 |
| KR | 101471097 | 12/2014 |

* cited by examiner

TRANSPARENT DISPLAY APPARATUS

CROSS-REFERENCE TO RELATED APPLICATION

This application claims priority to and the benefit of Korean Patent Application No. 10-2015-0095196, filed on Jul. 3, 2015, in the Korean Intellectual Property Office, the disclosure of which is incorporated by reference herein in its entirety.

TECHNICAL FIELD

One or more exemplary embodiments relate to a display apparatus, and more particularly, to a transparent display apparatus permitting viewing of objects disposed therebehind.

DISCUSSION OF THE RELATED ART

A transparent display apparatus may be manufactured by utilizing a transparent thin film transistor or a transparent display device therein.

An organic light-emitting diode (OLED) display apparatus is a self-emissive display apparatus and therefore does not require an additional light source, such as a backlight. Thus OLED display apparatuses may be driven at a low voltage and may be lightweight and thin. These displays may have excellent viewing angle characteristics, contrast, response speeds, or the like. However, OLED display apparatuses, like most display apparatuses, are generally opaque, and viewing such a display apparatus generally means that a viewer cannot see what is behind the display apparatus. Accordingly, most OLED display apparatuses are not well suited for uses in which it is necessary to see what is behind the display apparatus, such as for automobile heads-up displays (HUD) and augmented reality glasses.

SUMMARY

One or more exemplary embodiments include a transparent display apparatus having a light emission function and a transmission function.

Additional aspects will be set forth in part in the description which follows and, in part, will be apparent from the description, or may be learned by practice of the presented embodiments.

According to one or more exemplary embodiments, a display apparatus includes a pixel. The pixel includes a first area from which light is emitted and a second area through which external light is transmitted. A pixel circuit unit is disposed in the first area of the pixel. The pixel circuit includes at least one thin film transistor. An inorganic insulation layer is disposed in the second area of the pixel. A first insulation layer covers the pixel circuit unit in the first area, and has an opening exposing at least a portion of the inorganic insulation layer in the second area. A first electrode is disposed on the first insulation layer in the first area. The first electrode is electrically connected to the pixel circuit unit. A second insulation layer covers edges of the first electrode and is disposed outside the opening formed in the first insulation layer. A second electrode faces the first electrode and the second electrode is disposed in at least the first area. An intermediate layer is disposed between the first electrode and the second electrode and the intermediate layer includes an emissive layer.

The first insulation layer may include an organic insulation layer.

The second insulation layer may include an organic insulation layer.

The second insulation layer may cover edges of the first electrode in a closed loop shape.

A concave-convex pattern may be formed on an upper surface of the first insulation layer.

At least a portion of the pixel circuit unit may overlap the first electrode.

The inorganic insulation layer may include a single layer or a double layer. The inorganic insulation layer may include $SiO_2$ and/or $SiN_x$.

The thin film transistor may include an active layer. A gate electrode is disposed on the active layer and is insulated from the active layer. A third insulation layer is disposed between the active layer and the gate electrode. A plurality of fourth insulation layers is disposed on the gate electrode. A source electrode and a drain electrode are disposed on the plurality of fourth insulation layers and are respectively electrically connected to the active layer.

The source electrode and the drain electrode may each include a bottom electrode. The bottom electrode may include a first conductive material and a top electrode including a second conductive material.

The second conductive material may include a transparent conductive material.

The third insulation layer may include a same material as the inorganic insulation layer.

The display apparatus may further include a capacitor including a first capacitor electrode on a same layer as the gate electrode, a second capacitor electrode disposed between the plurality of fourth insulation layers, and a third capacitor electrode on a same layer as the source electrode and the drain electrode.

The display apparatus may further include a transparent conductive layer disposed on at least a portion of the inorganic insulation layer.

The first insulation layer may cover at least a portion of the transparent conductive layer.

The transparent conductive layer may completely cover an upper surface of the inorganic insulation layer.

Each of the gate electrode and the first capacitor electrode may include a bottom electrode. The bottom electrode may include a first conductive material. Each of the gate electrode and the first capacitor electrode may further include a top electrode including a second conductive material.

The first conductive material and the transparent conductive layer may include a same material.

BRIEF DESCRIPTION OF THE DRAWINGS

These and/or other aspects of the present disclosure will become apparent and more readily appreciated from the following description of exemplary embodiments of the present invention, taken in conjunction with the accompanying drawings in which.

DETAILED DESCRIPTION

Figure 1:
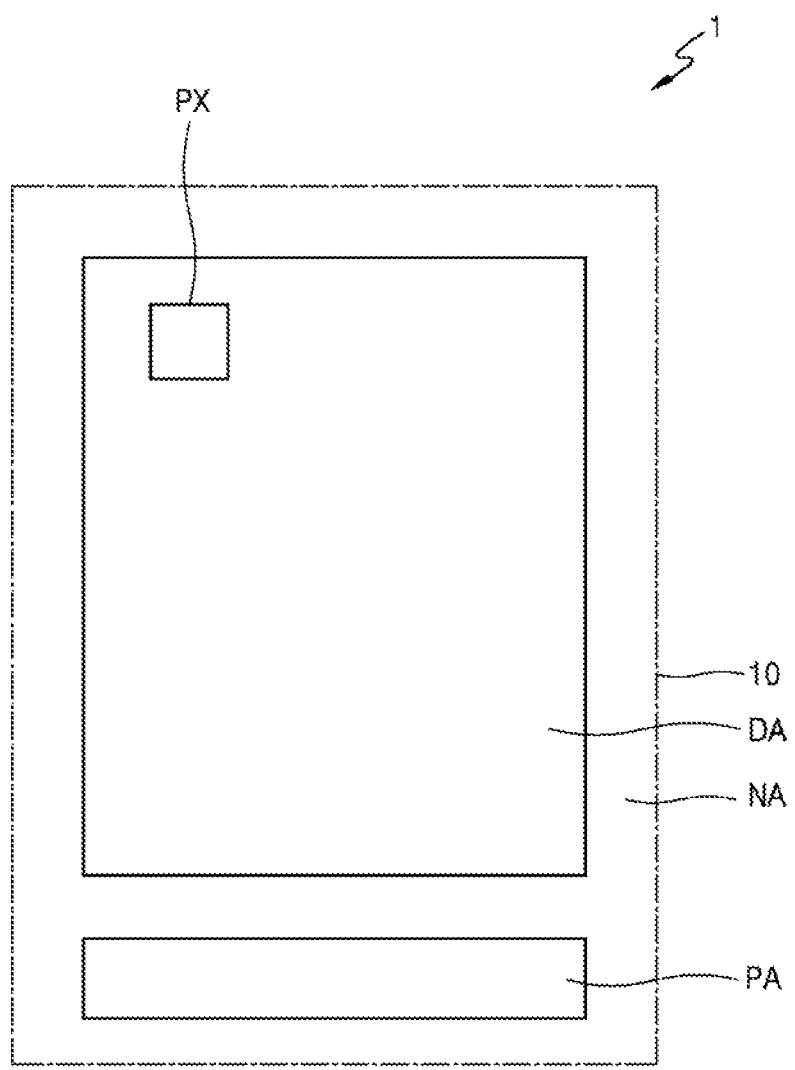
FIG. 1 is a schematic plan view illustrating a display apparatus according to an exemplary embodiment of the inventive concept.

Reference will now be made in detail to exemplary embodiments of the present invention, examples of which are illustrated in the accompanying drawings, wherein like reference numerals may refer to like elements throughout the disclosure and the figures. In this regard, the exemplary embodiments illustrated and described herein may have different forms and should not be construed as being limited to the exact manner illustrated and described.

Since the inventive concept may have various modifications and several embodiments, exemplary embodiments are shown in the drawings and will be described in detail. Aspects, features, and a method of achieving the same will be specified with reference to the exemplary embodiments described below in detail together with the attached drawings. However, the embodiments may have various different forms and should not be construed as being limited to the descriptions set forth herein.

It will be understood that although the terms "the first", "the second", etc. may be used herein to describe various components, these components should not be limited by these terms. These components are only used to distinguish one component from another.

It will also be understood that when an element such as a layer, an area or a component is referred to as being "connected" or "coupled" to another element, it can be directly connected or coupled to the other element with intervening elements therebetween.

Also, in the drawings, for convenience of description, sizes of elements may be exaggerated or contracted.

Figure 2:
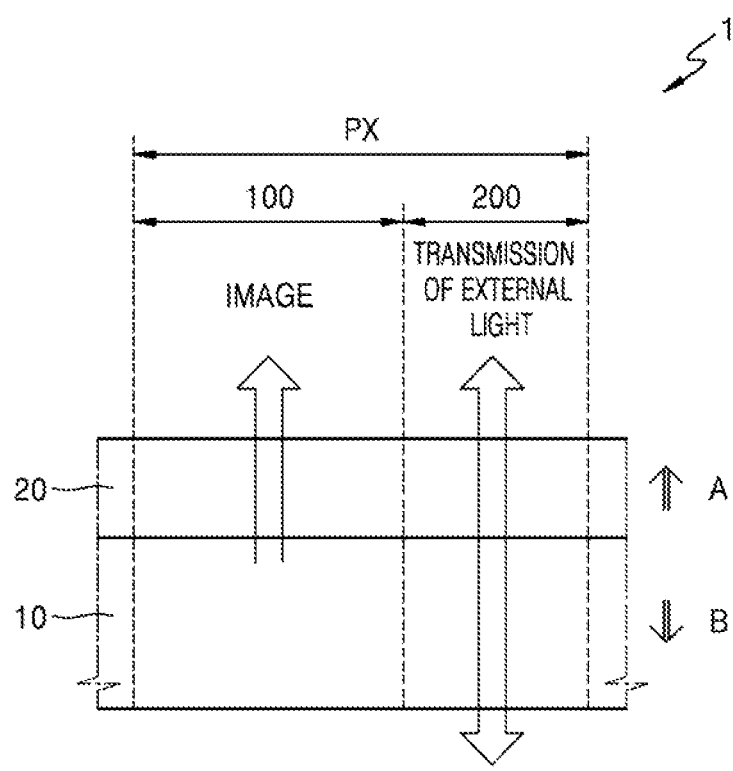
FIG. 2 is a cross-sectional view illustrating a portion of a display apparatus according to an exemplary embodiment of the inventive concept.

FIG. 1 is a schematic plan view illustrating a display apparatus 1 according to an exemplary embodiment of the inventive concept. FIG. 2 is a cross-sectional view illustrating a portion of the display apparatus 1 according to an exemplary embodiment of the inventive concept.

Referring to FIGS. 1 and 2, the display apparatus 1 according to an exemplary embodiment of the inventive concept includes a substrate 10 and a display unit 20 formed in a display area DA of the substrate 10. A pad unit PA is formed in a non-display area NA of the substrate 10 near the display area DA. The display apparatus 1 may be an organic light-emitting diode (OLED) display apparatus.

The display unit 20 includes a plurality of pixels PX. Each pixel PX includes a first area 100 and a second area 200. A displayed image is formed in the first area 100, from which light is emitted, and ambient light is transmitted through the second area 200. Ambient light transmits through the substrate 10 and the display unit 20. The ambient light transmitted through the substrate 10 and the display unit 20 may remain relatively unchanged and accordingly, objects disposed behind the display apparatus 1 may be visible through the substrate 10 and display unit 20.

The plurality of pixels PX may be arranged in a matrix form in a row direction and a column direction, although the pixels may alternatively be staggered. The pixels PX are arranged such that the first area 100 and the second area 200 have patterns that are alternately repeated in one direction. Thus, the first area 100 and the second area 200 are regularly arranged in the display unit 20 at predetermined intervals in one direction.

The display unit 20 is formed such that ambient light is transmitted therethrough, and a user who is looking at the display unit may view objects that are behind the substrate 10. According to the exemplary embodiment of the present invention, a top emission-type display apparatus in which an image of the display unit 20 is displayed at direction "A" of the substrate 10 is illustrated, but the present invention is not limited thereto. For example, the exemplary embodiments may also be applied to a bottom emission-type display apparatus in which an image of the display unit 20 is displayed at direction "B" of the substrate 10 and a dual emission-type display apparatus in which an image of the display unit 20 is displayed at both directions "A" and "B" of the substrate 10.

For example, according to an exemplary embodiment of the present invention, each pixel PX includes the first area 100 in which an image is formed and the second area 200 through which external light is transmitted, so that a user may view an image formed by the display unit 20 and/or an object through the display apparatus 1.

According to an exemplary embodiment of the present invention, in the display apparatus 1, a thin film transistor, a capacitor, a light-emitting device, or the like is not disposed in the second area 200 of the pixels PX so that the transmittance (transmittivity) of external light in the second area 200 may increase, resulting in an increase in the transmittance of ambient light through the display apparatus 1. In addition, the distortion of images that are transmitted, which may be due to interference with the thin film transistor, the capacitor, the light-emitting device, or the like, may be prevented.

The substrate 10 may be encapsulated by an encapsulation member. The encapsulation member may be an encapsulation substrate that is coupled to the substrate 10 with an encapsulation material or an encapsulation thin film having a structure in which an inorganic material and an organic material are alternately stacked on the substrate 10. A moisture absorbent, a filling material, or the like, may be included between the substrate 10 and the encapsulation member. The filling material may include silicon or the like.

Figure 3:
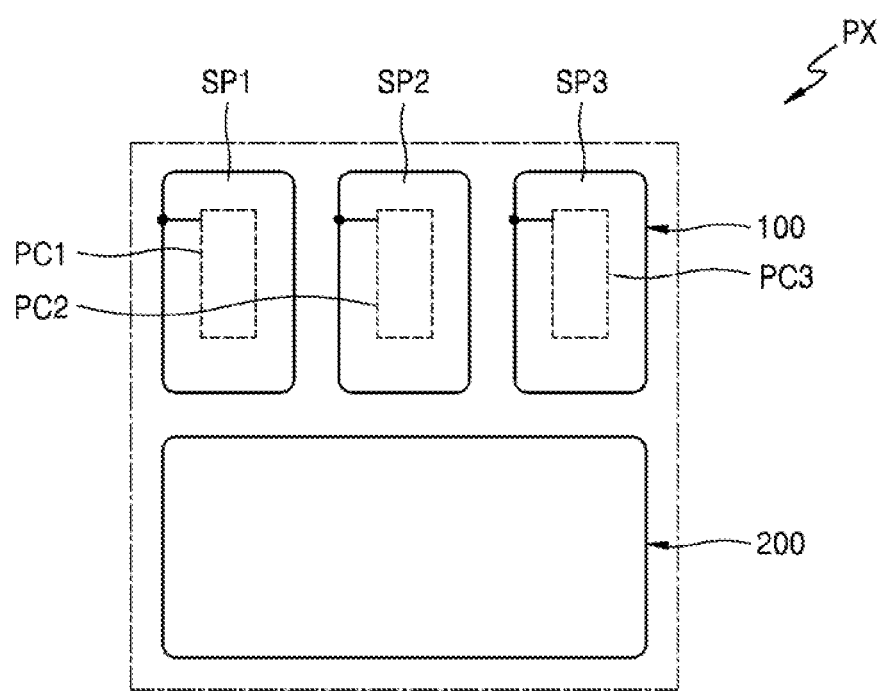
FIG. 3 is a schematic plan view illustrating pixels included in the display apparatus of FIG. 2.

FIG. 3 is a schematic plan view illustrating pixels PX included in the display apparatus 1 according to an exemplary embodiment of the inventive concept.

Referring to FIG. 3, each pixel PX includes the first area 100 from which light is emitted and the second area 200, which is adjacent to the first area 100, and through which ambient light is transmitted. A user may view an external object through the second area 200. For example, the display apparatus may be a transparent display.

A first sub-pixel SP1, a second sub-pixel SP2, and a third sub-pixel SP3 that emit different colors of light may be arranged in the first area 100. The first sub-pixel SP1, the second sub-pixel SP2, and the third sub-pixel SP3 may respectively emit red light, green light, and blue light. However, the present invention is not limited thereto, and as long as white light is formed, any color combination may be used. In addition, three or more sub-pixels or three or less sub-pixels may be disposed in the first area 100. The sub-pixels may each have identical or different sizes.

The first sub-pixel SP1, the second sub-pixel SP2, and the third sub-pixel SP3 may be respectively driven via a first pixel circuit unit PC1, a second pixel circuit unit PC2, and a third pixel circuit unit PC3.

The first pixel circuit unit PC1, the second pixel circuit unit PC2, and the third pixel circuit unit PC3 may be arranged such that at least portions of the first pixel circuit unit PC1, the second pixel circuit unit PC2, and the third pixel circuit unit PC3 respectively overlap first electrodes 121 (see FIG. 4) that are respectively included in the first sub-pixel SP1, the second sub-pixel SP2, and the third sub-pixel SP3.

The above arrangement may be suitable for a structure in which the first electrode 121 (see FIG. 4) is a reflective electrode, and a second electrode 125 (see FIG. 4) is a transparent electrode or a semi-transparent electrode. For example, for a top emission-type display apparatus. As first, second, and third pixel circuit units PC1, PC2, and PC3 are disposed between the substrate 10 and the first electrode 121, additional space for disposing the first, second, and third pixel circuit units PC1, PC2, and PC3 is not needed and thus an aperture ratio of the display apparatus may be increased.

However, the present invention is not limited to this particular arrangement. A display apparatus according to an exemplary embodiment of the present invention may be a bottom emission-type display apparatus in which a first electrode includes a transparent or semi-transparent electrode, and a second electrode includes a reflective electrode. In this case, a pixel circuit unit may be disposed so as not to overlap the first electrode so that a path of emitted light is not interrupted.

In the second area 200, an element that includes an opaque material, such as a reflective electrode or lines, need not be disposed, and for example, only transparent insulation layers may be disposed. The second area 200 may be partitioned by an opaque line that passes an edge area of each pixel PX.

Although second areas of the first sub-pixel SP1, the second sub-pixel SP2, and the third sub-pixel SP3 are illustrated as a single area in FIG. 3, the present invention is not limited to this particular arrangement. Only second areas of any two adjacent sub-pixels among the first sub-pixel SP1, the second sub-pixel SP2, and the third sub-pixel SP3 might be connected to each other as one area.

Figure 4:
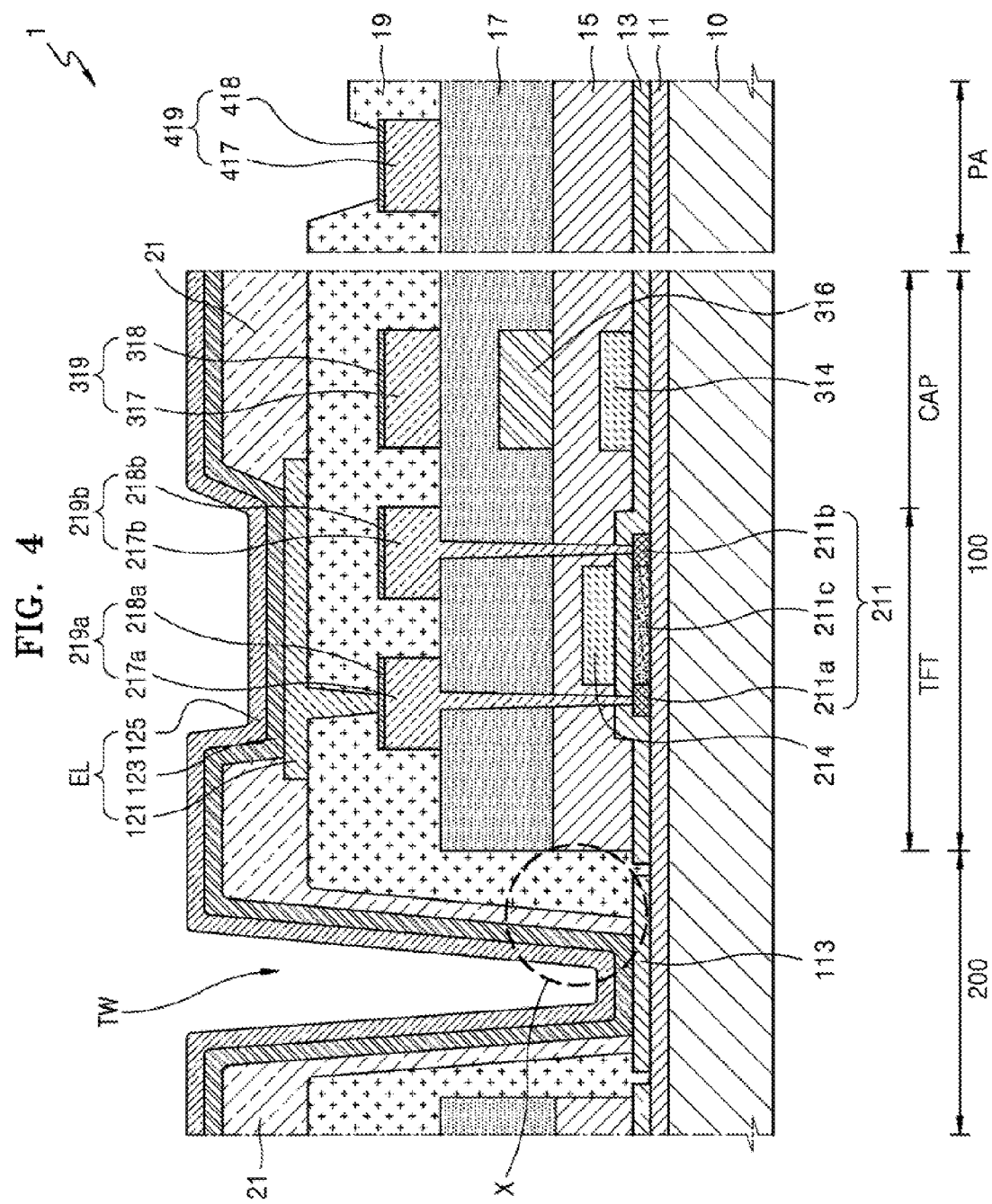
FIG. 4 is a cross-sectional view illustrating a portion of a pixel and a portion of a pad unit of a display apparatus according to an exemplary embodiment of the inventive concept.

FIG. 4 is a cross-sectional view illustrating a portion of a pixel and a portion of a pad unit of a display apparatus 1 according to an exemplary embodiment of the inventive concept.

Referring to FIG. 4, a pixel PX of the display apparatus 1 according to an exemplary embodiment of the present invention is disposed on a substrate 10 and the pixel PX includes a first area 100 from which light is emitted and a second area 200 through which ambient light is transmitted. A pixel defining layer 21 helps to define the pixel PX.

A buffer layer 11 may be disposed on the substrate 10. A pixel circuit unit including at least one thin film transistor TFT and at least one capacitor CAP and a light-emitting device EL are disposed on the buffer layer 11 in the first area 100. At least a portion of the pixel circuit unit overlaps the light-emitting device EL.

The thin film transistor TFT includes an active layer 211, a gate electrode 214 that is insulated from the active layer 211, and a source electrode 219a and a drain electrode 219b that are respectively electrically connected to the active layer 211. The active layer 211 includes a source area 211a, a drain area 211b, and a channel region 211c disposed therebetween. The source electrode 219a includes a first source electrode 217a and a second source electrode 218a. The drain electrode 219b includes a first drain electrode 217b and a second drain electrode 218b.

A first insulation layer 13 may be disposed between the active layer 211 and the gate electrode 214. A second insulation layer 15 and a third insulation layer 17 may be disposed between the gate electrode 214 and the source electrode 219a as well as between the gate electrode 214 and the drain electrode 219b.

The capacitor CAP includes a first capacitor electrode 314 on a same layer as the gate electrode 214, a second capacitor electrode 316 disposed between the second insulation layer 15 and the third insulation layer 17, and a third capacitor electrode 319 on a same layer as the source electrode 219a and the drain electrode 219b. The third capacitor electrode 319 includes a third capacitor bottom electrode 317 and a third capacitor top electrode 318.

The second insulation layer 15 may be disposed between the first capacitor electrode 314 and the second capacitor electrode 316, and the third insulation layer 17 may be disposed between the second capacitor electrode 316 and the third capacitor electrode 319.

The light-emitting device EL includes a first electrode 121, a second electrode 125 facing the first electrode 121, and an intermediate layer 123 that is disposed between the first electrode 121 and the second electrode 125 and includes an organic emissive layer. The first electrode 121 is disposed on a fourth insulation layer 19, and is electrically connected to the source electrode 219a or the drain electrode 219b (connected to the source electrode 219a in the exemplary embodiment of FIG. 4). Edges of the first electrode 121 are covered by a pixel-defining layer 21.

The intermediate layer 123 may include an organic emissive layer emitting light. The intermediate layer 123 may be disposed between the first electrode 121 and the second electrode 125.

An inorganic insulation layer 113 is disposed on the buffer layer 11 in the second area 200. The intermediate layer 123 and the second electrode 125 extending from the first area 100 may be disposed on the inorganic insulation layer 113. Edges of the inorganic insulation layer 113 are covered by the fourth insulation layer 19 and the pixel-defining layer 21.

A pad electrode 419, which is a connection terminal of an external driver, is disposed in the pad unit PA. The pad electrode 419 is formed on the third insulation layer 17 and includes a first pad electrode 417 and a second pad electrode 418.

As shown in the display apparatus 1 illustrated in FIG. 4, the pixels include the first area 100 and the second area 200, through which ambient light is transmitted, and thus the display apparatus 1 may be a transparent display apparatus.

Figure 5:
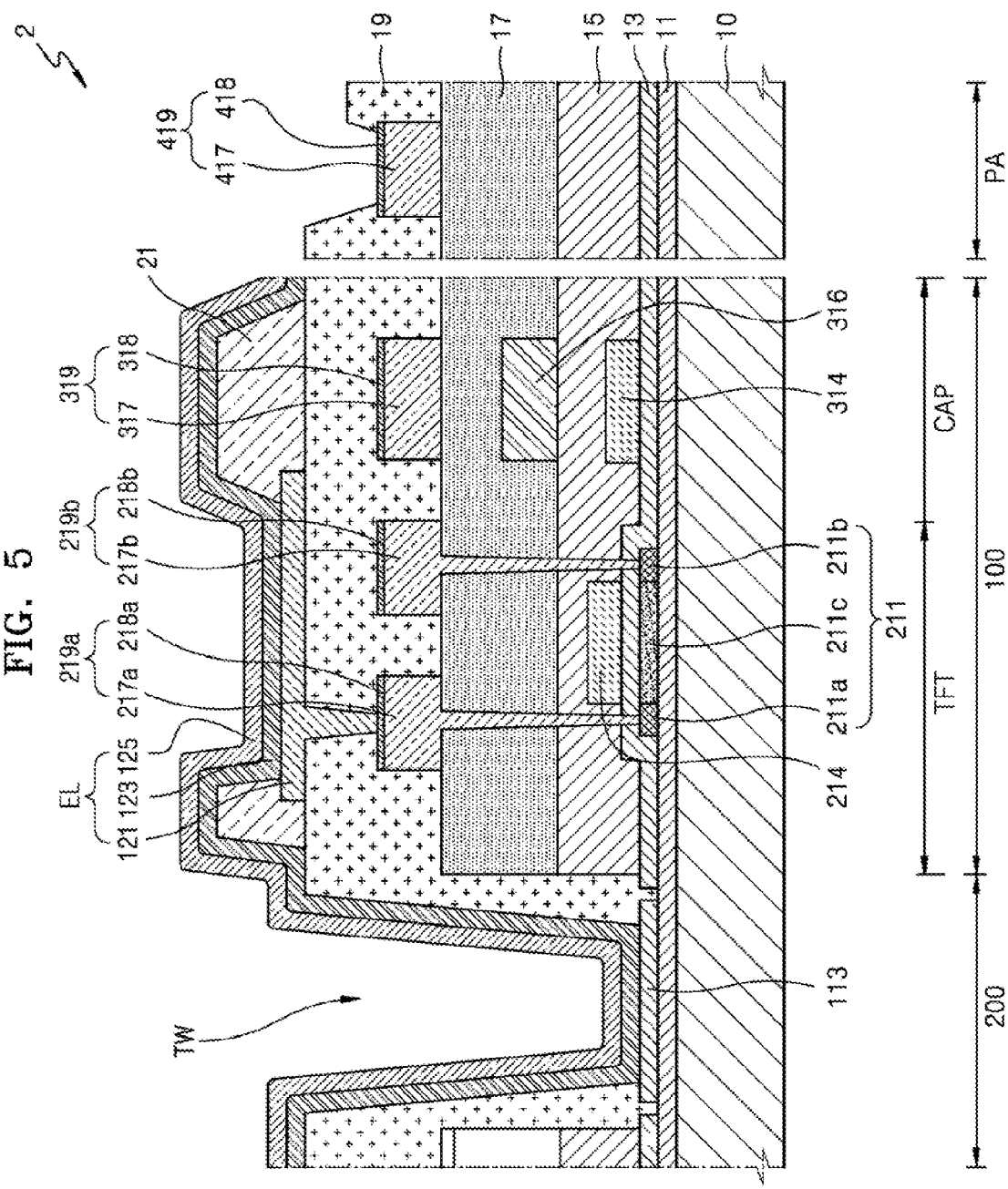
FIG. 5 is a cross-sectional view illustrating a portion of a pixel and a portion of a pad unit of a display apparatus according to an exemplary embodiment of the inventive concept.

FIG. 5 is a cross-sectional view illustrating a portion of a pixel and a portion of a pad unit of a display apparatus 2 according to an exemplary embodiment of the inventive concept. The elements shown in FIGS. 1 through 3 may also be applied to the display apparatus 2 of FIG. 5.

Referring to FIG. 5, a pixel PX of the display apparatus 2 is disposed on a substrate 10 and includes a first area 100 from which light is emitted and a second area 200 through which ambient light is transmitted. A plurality of first through fourth insulation layers 13, 15, 17, and 19 are within the first area 100. Light-emitting devices EL are disposed on the first through fourth insulation layers 13, 15, 17, 19 within the first area 100. A pixel circuit unit is disposed under the light-emitting devices EL in the first area 100. The second area 200 is adjacent to a side of the first area 100. An inorganic insulation layer 113 is disposed on the buffer layer 11 in the second area 200. The first, second, and third insulation layers 13, 15, and 17 are not disposed on the inorganic insulation layer 113 of the second area 200. An opening OP2 (see FIG. 12) formed in the fourth insulation layer 19 is in the second area 200 so that the fourth insulation layer 19 covers one or more edges of the inorganic insulation layer 113 while a portion of the inorganic insulation layer 113 is left exposed and uncovered by the fourth insulation layer 19.

The buffer layer 11 may be disposed on the substrate 10. A pixel circuit unit includes at least one thin film transistor TFT and at least one capacitor CAP disposed on the buffer layer 11 in the first area 100. A light-emitting device EL is also disposed on the buffer layer 11 in the first area 100. At least a portion of the pixel circuit unit overlaps the light-emitting device EL.

The thin film transistor TFT includes an active layer 211, a gate electrode 214 that is insulated from the active layer 211, and a source electrode 219a and a drain electrode 219b that are respectively electrically connected to the active layer 211. The source electrode 219a includes a first source electrode 217a and a second source electrode 218a. The drain electrode 219b includes a first drain electrode 217b and a second drain electrode 218b.

The first insulation layer 13 may be disposed between the active layer 211 and the gate electrode 214. The second insulation layer 15 and the third insulation layer 17 may both be disposed between the gate electrode 214 and the source electrode 219a as well as between the gate electrode 214 and the drain electrode 219b.

The capacitor CAP includes a first capacitor electrode 314 that is disposed on a same layer as the gate electrode 214. The capacitor CAP further includes a second capacitor electrode 316 disposed between the second insulation layer 15 and the third insulation layer 17 and a third capacitor electrode 319 disposed on a same layer as the source electrode 219a and the drain electrode 219b. The third capacitor electrode 319 includes a third capacitor bottom electrode 317 and a third capacitor top electrode 318.

The second insulation layer 15 may be disposed between the first capacitor electrode 314 and the second capacitor electrode 316. The third insulation layer 17 may be disposed between the second capacitor electrode 316 and the third capacitor electrode 319.

The light-emitting device EL includes a first electrode 121, a second electrode 125 facing the first electrode 121, and an intermediate layer 123 that is disposed between the first electrode 121 and the second electrode 125. The intermediate layer 123 includes an organic emissive layer. The first electrode 121 is disposed on the fourth insulation layer 19 covering the pixel circuit unit, and is electrically connected to the source electrode 219a or the drain electrode 219b (the first electrode 121 is shown as being electrically connected to the source electrode 219a in FIG. 5). Edges of the first electrode 121 are covered by a pixel-defining layer 21.

Figure 6:
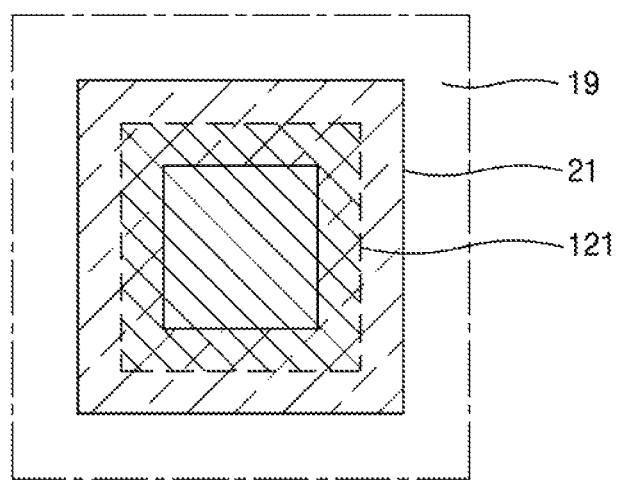
FIG. 6 is a plan view illustrating an arrangement of a first electrode and a pixel-defining layer of the display apparatus of FIG. 5.

FIG. 6 is a plan view illustrating an arrangement of a first electrode 121 and a pixel-defining layer 21 according to an exemplary embodiment of the present invention. The pixel-defining layer 21 is not formed over the entire fourth insulation layer 19 but rather covers only edges of the first electrode 121 in a closed loop shape, and may be formed exclusively on a portion of the fourth insulation layer 19. For example, the pixel-defining layer 21 is formed exclusively in a portion of the first area 100 but the pixel-defining layer 21 is not formed in the second area 200. While the pixel-defining layer 21 is illustrated in FIG. 6 as having a closed loop shape, which may be thought of as a rectangular donut shape, the present invention is not limited to this particular arrangement. While the pixel-defining layer 21 having a uniform width along the edges of the first electrode 121 is illustrated in FIG. 6, the instant invention is not limited to this particular arrangement. For example, a width of the pixel-defining layer 21 on edges at one side portion of the first electrode 121 may be greater than or less than a width of the pixel-defining layer 21 on edges of the other side portion of the first electrode 121.

The first electrode 121 may include a reflective electrode, and may include a reflective layer including, for example, Ag, Mg, Al, Pt, Pd, Au, Ni, Nd, Ir, Cr or a compound of these, and a transparent or semi-transparent electrode layer formed on the reflective layer. The first electrode 121, having an island shape, may be formed for each sub-pixel.

The second electrode 125 may include a transparent or semi-transparent electrode, and may include at least one Ag, Al, Mg, Li, Ca, Cu, LiF/Ca, LiF/Al, MgAg, or CaAg. The second electrode 125 may comprise a film having a thickness of several nm to several tens of nm. The second electrode 125 may be electrically connected to all pixels included in the display apparatus 2.

The intermediate layer 123 may be disposed between the first electrode 121 and the second electrode 125. The intermediate layer 123 includes an organic emissive layer that emits light. At least one of a hole injection layer (HIL), a hole transport layer (HTL), an electron transport layer (ETL), and an electron injection layer (EIL) may be further disposed in the intermediate layer 123. However, the present invention is not limited to this particular arrangement, and other various functional layers may also be disposed between the first electrode 121 and the second electrode 125.

The organic emissive layer may emit red light, green light and/or blue light. However, the organic emissive layer may alternatively or additionally emit white light or other colors that may be used to display an image. According to one exemplary approach, the organic emissive layer may have a structure in which an emissive material emitting red light, an emissive material emitting green light, and an emissive material emitting blue light are stacked to form white light, or may have a structure in which an emissive material emitting red light, an emissive material emitting green light, and an emissive material emitting blue light are mixed to form white light.

The emission of red, green and blue colors is described as an example, and the invention is not limited to these particular colors. For example, as long as white light is emitted, a combination of various colors other than the above described combination of red, green, and blue colors may be used.

The display apparatus 2 according to an exemplary embodiment of the present invention may be a top emission-type display apparatus in which an image is formed at a side of the second electrode 125, and the first, second, and third pixel circuit units PC1, PC2, and PC3 (FIG. 3) including the thin film transistor TFT or the like may be disposed between the substrate 10 and the first electrode 121.

The inorganic insulation layer 113 is disposed on the buffer layer 11 in the second area 200. The inorganic insulation layer 113 is disposed on the buffer layer 11. Edges of the inorganic insulation layer 113 are covered by the fourth insulation layer 19. For example, the inorganic insulation layer 113 is disposed on the buffer layer 11 within the second area 200. An opening is formed in the fourth insulation layer 19 exposing at least a portion of the inorganic insulation layer 113 within the second area 200. The intermediate layer 123 and the second electrode 125 extending from the first area 100 may be disposed on the inorganic insulation layer 113. The intermediate layer 123 disposed in the second area 200 might not include an organic emissive layer. The second electrode 125 may include a transmission window TW formed at a position corresponding to the second area 200.

The inorganic insulation layer 113 may be a single layer or a double layer including $SiO_2$ and/or $SiN_x$, and may include a same material as the first insulation layer 13. In regard to the display apparatus 2 according to an exemplary embodiment, when the inorganic insulation layer 113 disposed in the second area 200 includes a single layer, interface reflection that may occur at an interface between layers having difference refractive indices may be minimized, thereby increasing the transmittance of the display apparatus 2.

While the intermediate layer 123 and the second electrode 125 are illustrated as being disposed in the second area 200 in FIG. 5, the intermediate layer 123 and the second electrode 125 might not be disposed in the second area 200, and in this case, the transmittance of the second area 200 may be further increased.

A pad electrode 419, which is a connection terminal of an external driver, is disposed in the pad unit PA. The pad electrode 419 may be formed on the third insulation layer 17, and the pad electrode 419 includes a first pad electrode 417 and a second pad electrode 418.

Edges of the second pad electrode 418 are covered by the fourth insulation layer 19. The second pad electrode 418 prevents exposure of the first pad electrode 417 to moisture and oxygen, thereby preventing degradation of the pad unit PA and increasing reliability thereof.

Although not illustrated, a capping layer may be additionally disposed on the second electrode 125. The capping layer may have a single layer structure including a single material including an organic material and/or an inorganic material, or a multi-layer structure including various materials having different refractive indices.

The first, second, and third insulation layers 13, 15, and 17 may be inorganic insulation layers. The fourth insulation layer 19 and the pixel-defining layer 21 may be organic insulation layers.

According to the display apparatus 2 illustrated in FIG. 5, the pixel-defining layer 21, which is an organic insulation layer, is disposed exclusively in the first area 100 and is not disposed in the second area 200.

According to the display apparatus 1 illustrated in FIG. 4, the fourth insulation layer 19 and the pixel-defining layer 21 cover edges of the inorganic insulation layer 113. As the two organic insulation layers (for example, the fourth insulation layer 19 and the pixel-defining layer 21) are disposed along a lateral surface of the openings OP1 and OP2 in the second area 200, a taper angle is increased. Accordingly, detachment occurs between fourth insulation layer 19 and the pixel-defining layer 21 in an area X of the edges of the inorganic insulation layer 113, step coverage is degraded, and cracks are generated in the second electrode 125. Foreign substances, such as a filling material present between the substrate 10 and the encapsulation member, may penetrate into the organic emissive layers of the first area 100 through the cracks in the second electrode 125 in the second area 200 due to capillarity action. Accordingly, non-emission areas may be generated in the light-emitting device EL of the first areas 100.

For example, according to the display apparatus 2 of FIG. 5, only the fourth insulation layer 19, which is an organic insulation layer, covers the edges of the inorganic insulation layer 113. Thus, a taper angle of the lateral surface of the opening OP2 of the second area 200 is reduced to be less than that of the display apparatus 1 illustrated in FIG. 4. Thus, step coverage in the second area 200 is increased to thereby prevent cracks in the second electrode 125, and as a result, penetration of foreign substances into the organic emissive layer may also be prevented.

FIGS. 7 through 14 are cross-sectional views illustrating a method of manufacturing the display apparatus 2 illustrated in FIG. 5 according to an exemplary embodiment of the present invention.

Figure 7:
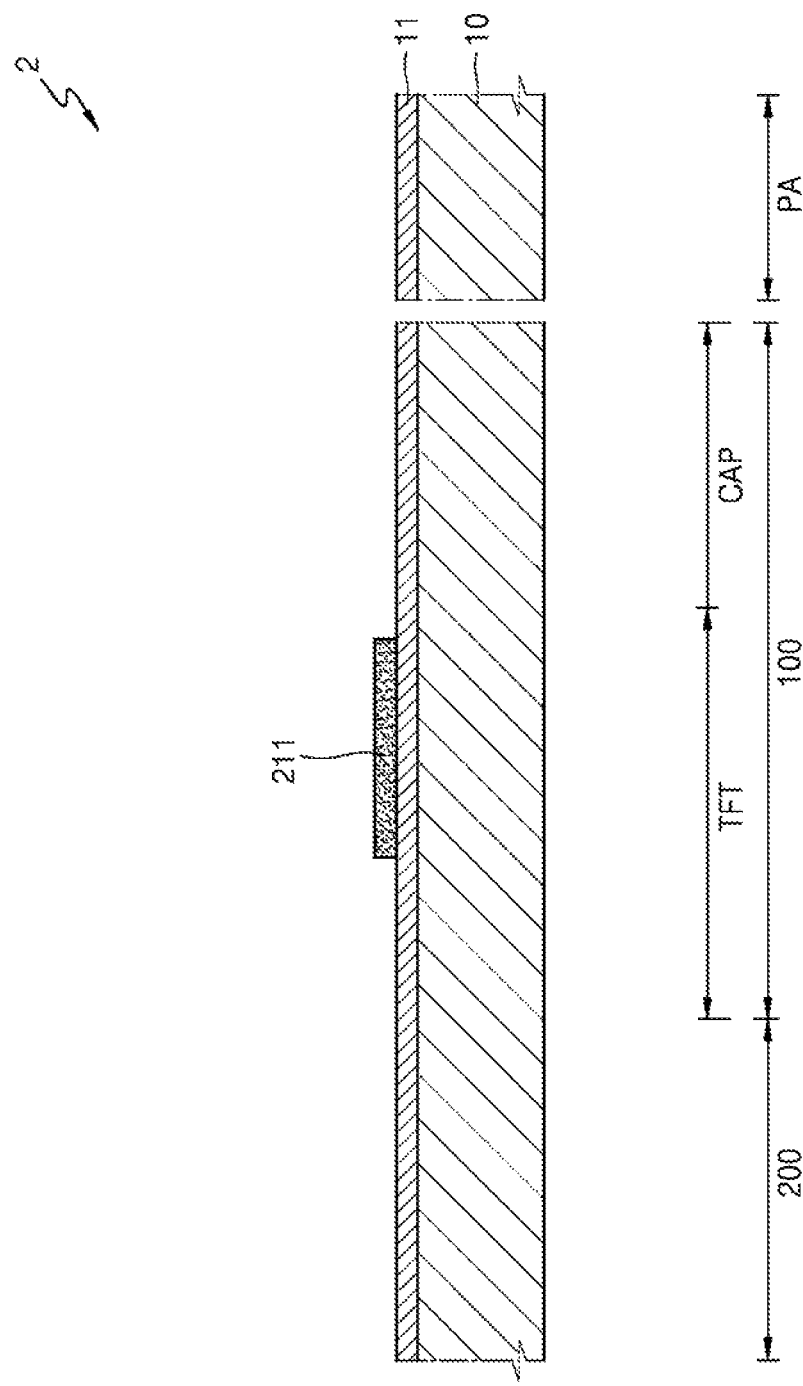
FIGS. 7 through 14 are cross-sectional views illustrating a method of manufacturing a display apparatus according to an exemplary embodiment of the inventive concept.

FIG. 7 is a cross-sectional view of a first mask process. Here, a buffer layer 11 is disposed on a substrate 10, and a semiconductor layer is formed on the buffer layer 11. Then, the semiconductor layer is patterned to form an active layer 211 of a thin film transistor TFT.

The substrate 10 may include glass or plastic. The buffer layer 11 prevents penetration of impurity elements through the substrate 10 and planarizes a surface of the substrate 10. The buffer layer 11 may be formed as a single layer or as multiple layers. The layer(s) of the buffer layer 11 may include an inorganic material such as a silicon nitride ($SiN_x$) and/or a silicon oxide ($SiO_x$).

The semiconductor layer may include various materials. For example, the semiconductor layer may include an inorganic semiconductor material such as an amorphous silicon or crystalline silicon. Alternatively, the semiconductor layer may include an oxide semiconductor or an organic semiconductor material.

Figure 8:
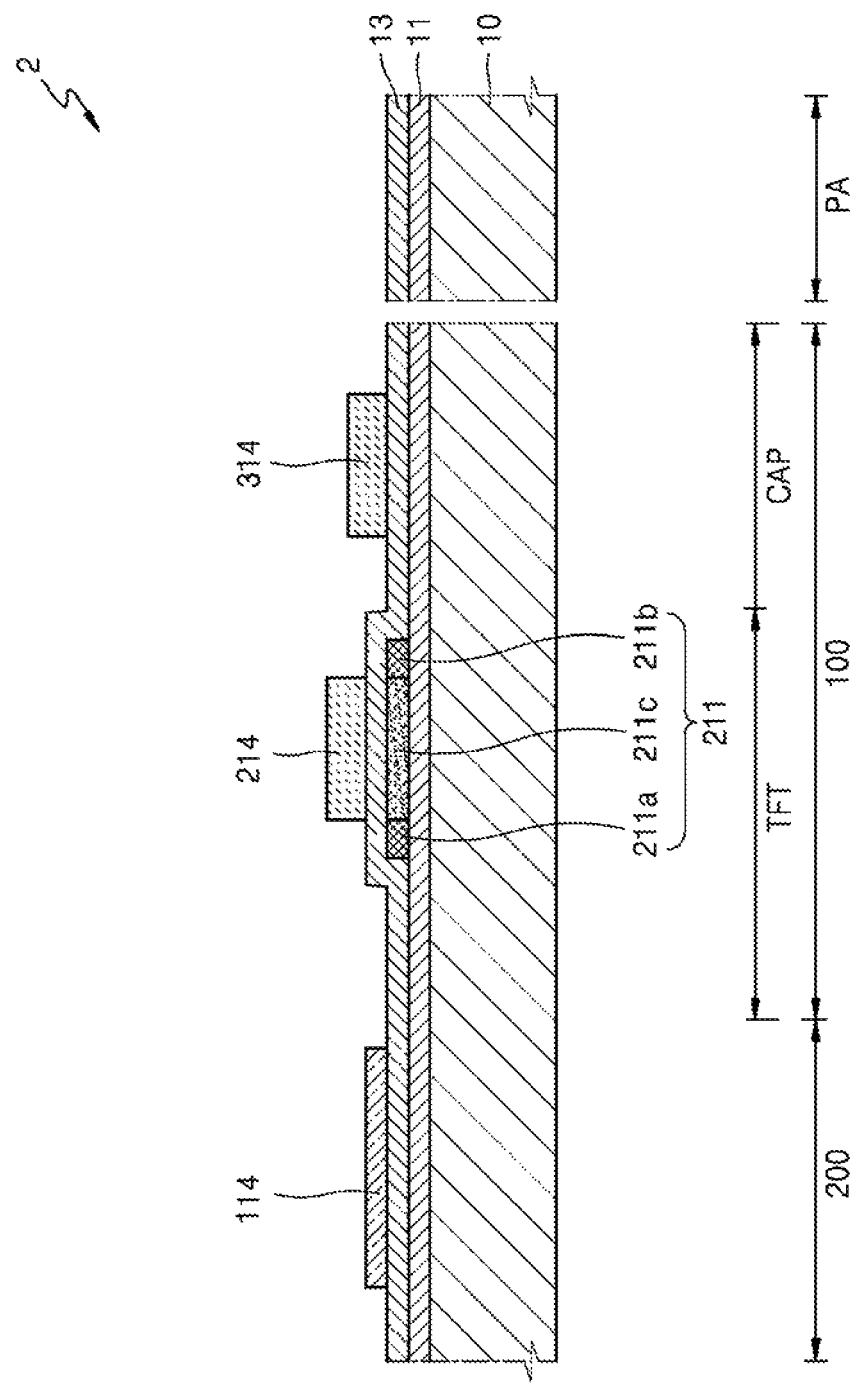

FIG. 8 is a cross-sectional view illustrating a second mask process. A first insulation layer 13 is formed on a resultant product of the first mask process shown in FIG. 7, and a first conductive layer is formed on the first insulation layer 13, and the first conductive layer is then patterned. Accordingly, a gate electrode 214 of the thin film transistor TFT and a first capacitor electrode 314 of a capacitor CAP are formed in the first area 100, and a metal pattern 114 is formed in the second area 200.

The first insulation layer 13 may include an inorganic insulation layer. The first insulation layer 13 may include $SiO_2$, $SiN_x$, SiON, $Al_2O_3$, $TiO_2$, $Ta_2O_5$, $HfO_2$, $ZrO_2$, BST, and/or PZT as a single layer or as multiple layers.

The structure of the second mask process illustrated in FIG. 8 is doped with B or P ion impurities. Accordingly, the active layer 211 is made to include a source area 211*a* and a drain area 211*b* doped with ion impurities, and a channel area 211*c* disposed between the source and drain areas 211*a* and 211*b*.

The first conductive layer may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and as a single layer or as multiple layers. The first conductive layer may include three layers of, for example, a Mo/Al/Mo structure or a Ti/Al/Ti structure.

Figure 9:
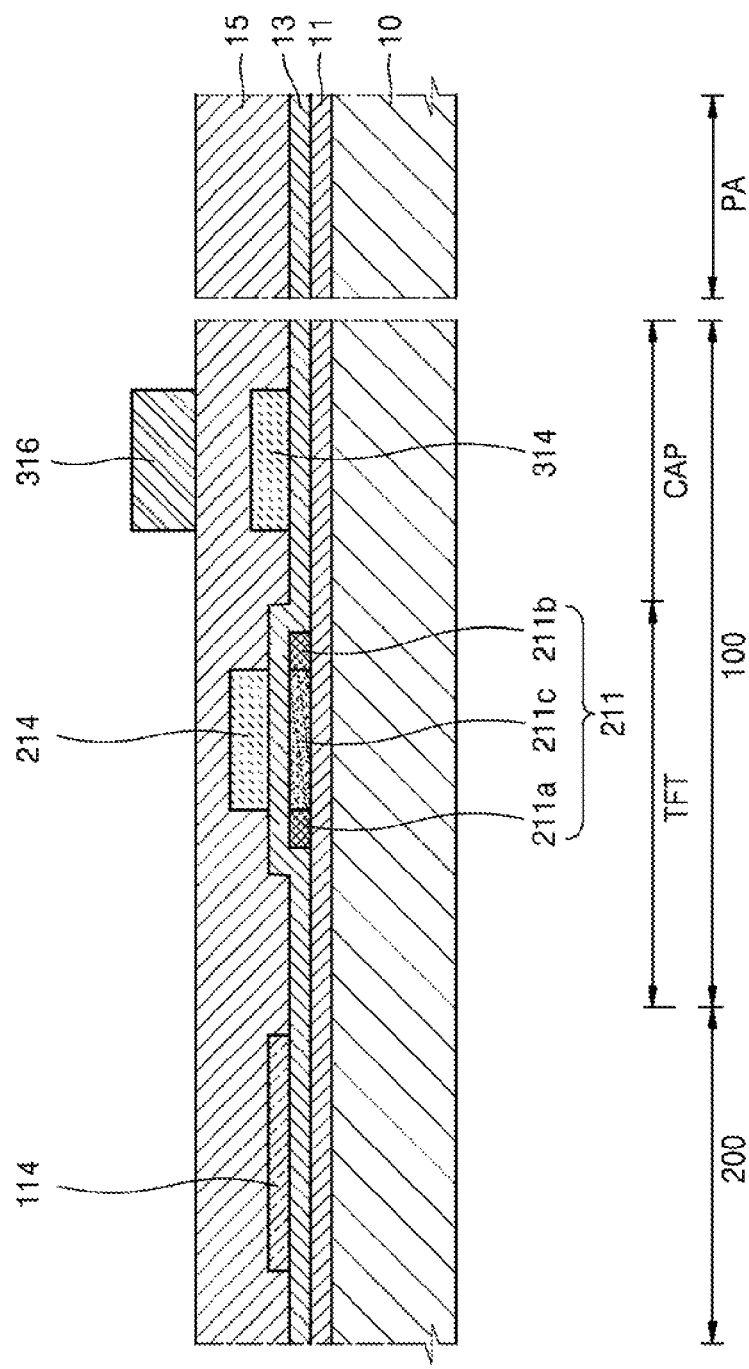

FIG. 9 is a cross-sectional view illustrating a third mask process. A second insulation layer 15 is formed on a resultant product of the second mask process of FIG. 8, and a second conductive layer is formed on the second insulation layer 15 and is then patterned. Accordingly, a second capacitor electrode 316 of the capacitor CAP is formed.

The second insulation layer 15 may include an inorganic insulation layer. The second insulation layer 15 may include at least one insulation layer including $SiO_2$, $SiN_x$, SiON, $Al_2O_3$, $TiO_2$, $Ta_2O_5$, $HfO_2$, $ZrO_2$, BST, and/or PZT and the second insulation layer may be as a single layer or may include multiple layers.

The second conductive layer may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and the second conductive layer may be a single layer or may include multiple layers. The first conductive layer may include three layers of, for example, a Mo/Al/Mo structure or a Ti/Al/Ti structure.

Figure 10:
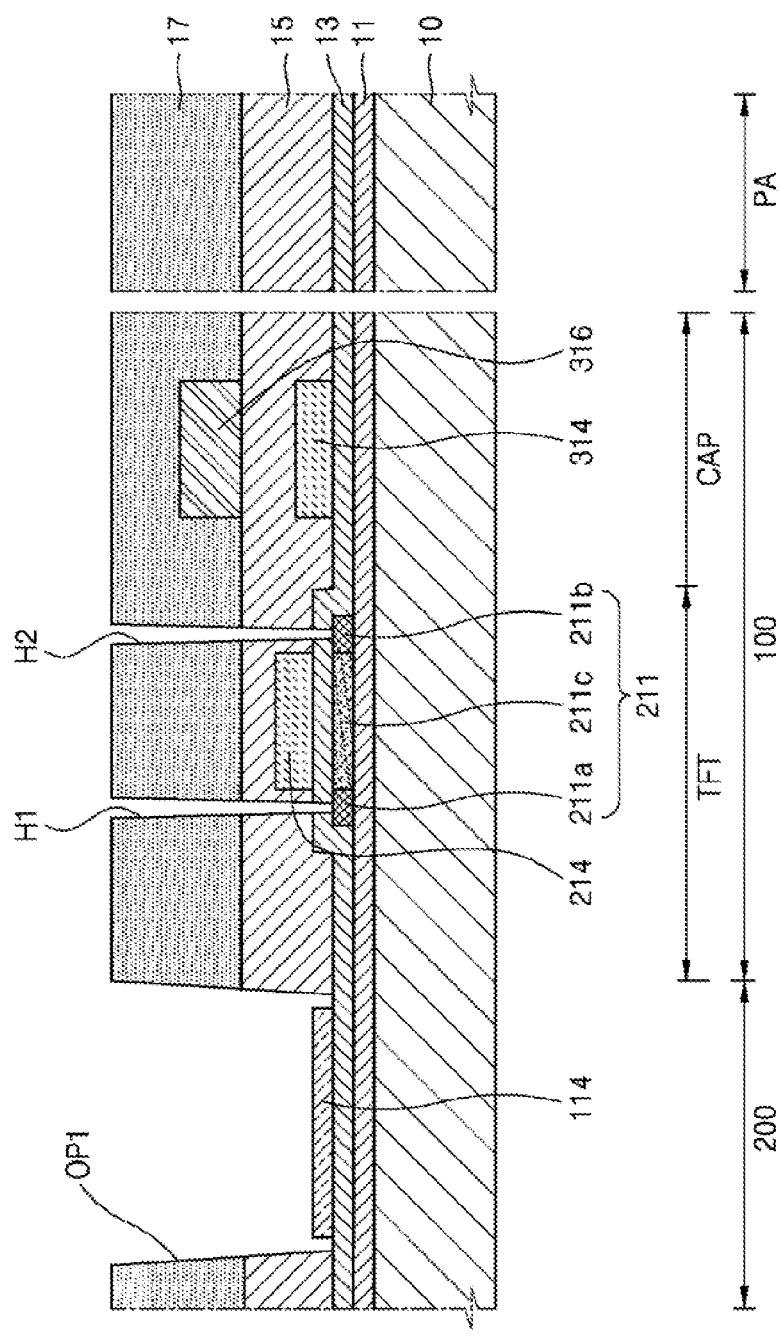

FIG. 10 is a cross-sectional view illustrating a fourth mask process. A third insulation layer 17 is formed on a resultant product of the third mask process, and the first insulation layer 13, the second insulation layer 15, and the third insulation layer 17 are patterned. Accordingly, contact holes H1 and H2 are formed in the first insulation layer 13, the second insulation layer 15, and the third insulation layer 17 to expose portions of the source area 211a and the drain area 211b of the active layer 211. An opening OP1 is formed in the second insulation layer 15 and the third insulation layer 17 to expose the metal pattern 114. In the second area, the metal pattern 114 is spaced apart from the active layer 211 and the metal pattern 114 is disposed next to the active layer 211.

The third insulation layer 17 may include an inorganic insulation layer. The third insulation layer 17 may include $SiO_2$, $SiN_x$, SiON, $Al_2O_3$, $TiO_2$, $Ta_2O_5$, $HfO_2$, $ZrO_2$, BST, and/or PZT. The third insulation layer 17 may be a single layer or it may include multiple layers.

Figure 11:
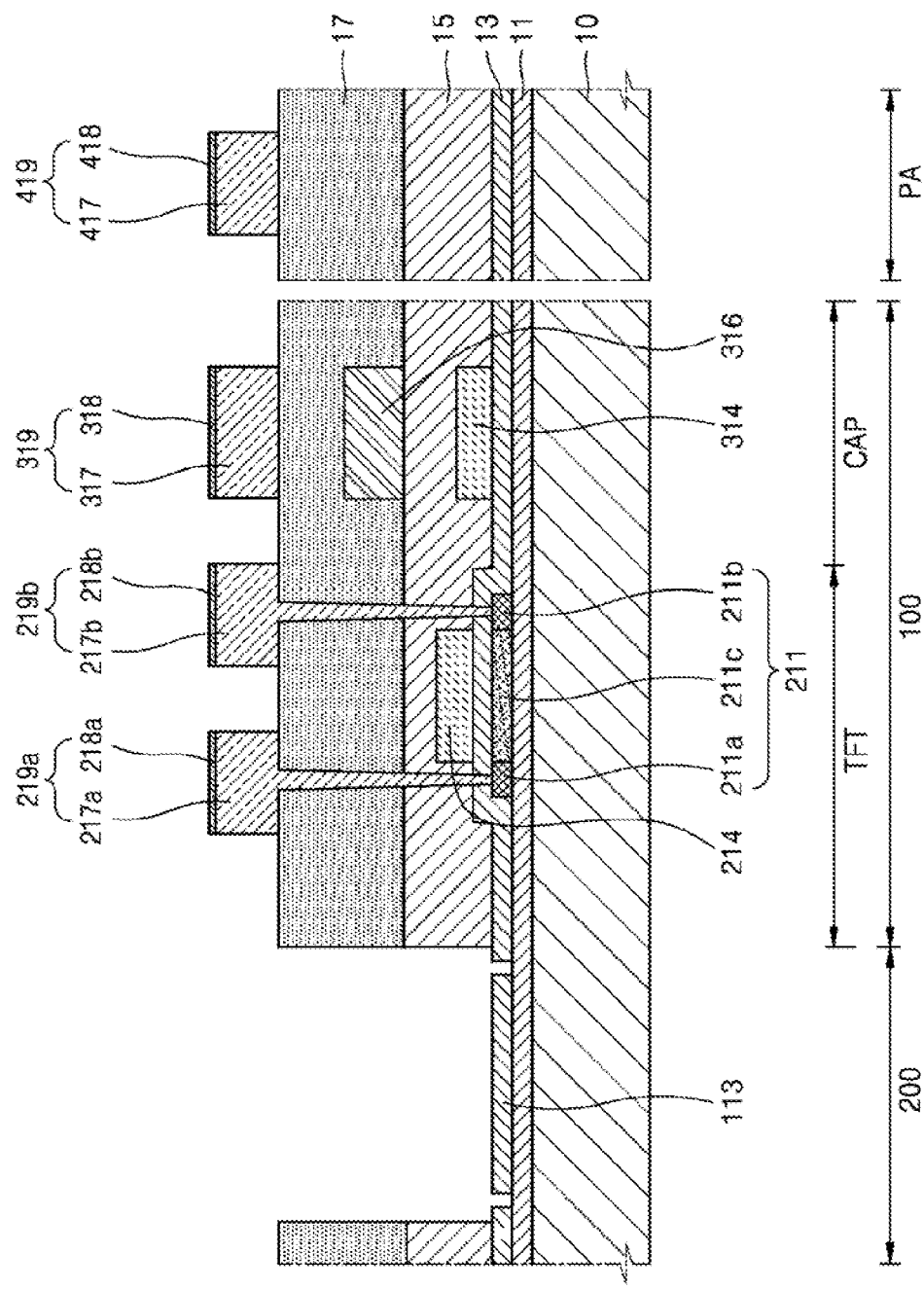

FIG. 11 is a cross-sectional view illustrating a fifth mask process. A third conductive layer and a fourth conductive layer are continuously formed on a resultant product of the fourth mask process of FIG. 10, and the third conductive layer and the fourth conductive layer are simultaneously patterned. Accordingly, a source electrode 219a and a drain electrode 219b of the thin film transistor TFT and a third capacitor electrode 319 of the capacitor CAP are formed in the first area 100. The metal pattern 114 is removed from the second area 200, and an inorganic insulation layer 113 corresponding to the metal pattern 114 is formed. While the first insulation layer 13 is patterned to form the inorganic insulation layer 113 illustrated in FIG. 11, the instant invention is not limited to this arrangement. Without patterning the first insulation layer 13, a portion of the first insulation layer 13 disposed in the second area 200 may function as the inorganic insulation layer 113. A pad electrode 419 is formed in the pad unit PA.

The third conductive layer may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and/or an alloy thereof. and the third conductive layer may be a single layer or may include multiple layers.

The fourth conductive layer may include a transparent conductive oxide including at an indium tin oxide (ITO), an indium zinc oxide (IZO), a zinc oxide (ZnO), an indium oxide ($In_2O_3$), an indium gallium oxide (IGO), and/or an aluminum zinc oxide (AZO).

The source electrode 219a includes a first source electrode 217a formed of a portion of the third conductive layer and a second source electrode 218a formed of a portion of the fourth conductive layer. The drain electrode 219b includes a first drain electrode 217b formed of a portion of the third conductive layer and a second drain electrode 218b formed of a portion of the fourth conductive layer. The third capacitor electrode 319 includes a third capacitor bottom electrode 317 formed of a portion of the third conductive layer and a third capacitor top electrode 318 formed of a portion of the fourth conductive layer. The pad electrode 419 includes a first pad electrode 417 formed of a portion of the third conductive layer and a second pad electrode 418 formed of a portion of the fourth conductive layer.

The second source electrode 218a, the second drain electrode 218b, the third capacitor top electrode 318, and the second pad electrode 418 may respectively function as protection layers for the first source electrode 217a, the first drain electrode 217b, the third capacitor bottom electrode 317, and the first pad electrode 417.

As the third conductive layer and the fourth conductive layer are patterned in the same mask process, the first source electrode 217a, the first drain electrode 217b, the third capacitor bottom electrode 317, and the first pad electrode 417 may respectively have the same etching surfaces as the second source electrode 218a, the second drain electrode 218b, the third capacitor top electrode 318, and the second pad electrode 418. However, the instant invention is not limited to this particular configuration. For example, the third conductive layer and the fourth conductive layer may be patterned in separate processes.

Figure 12:
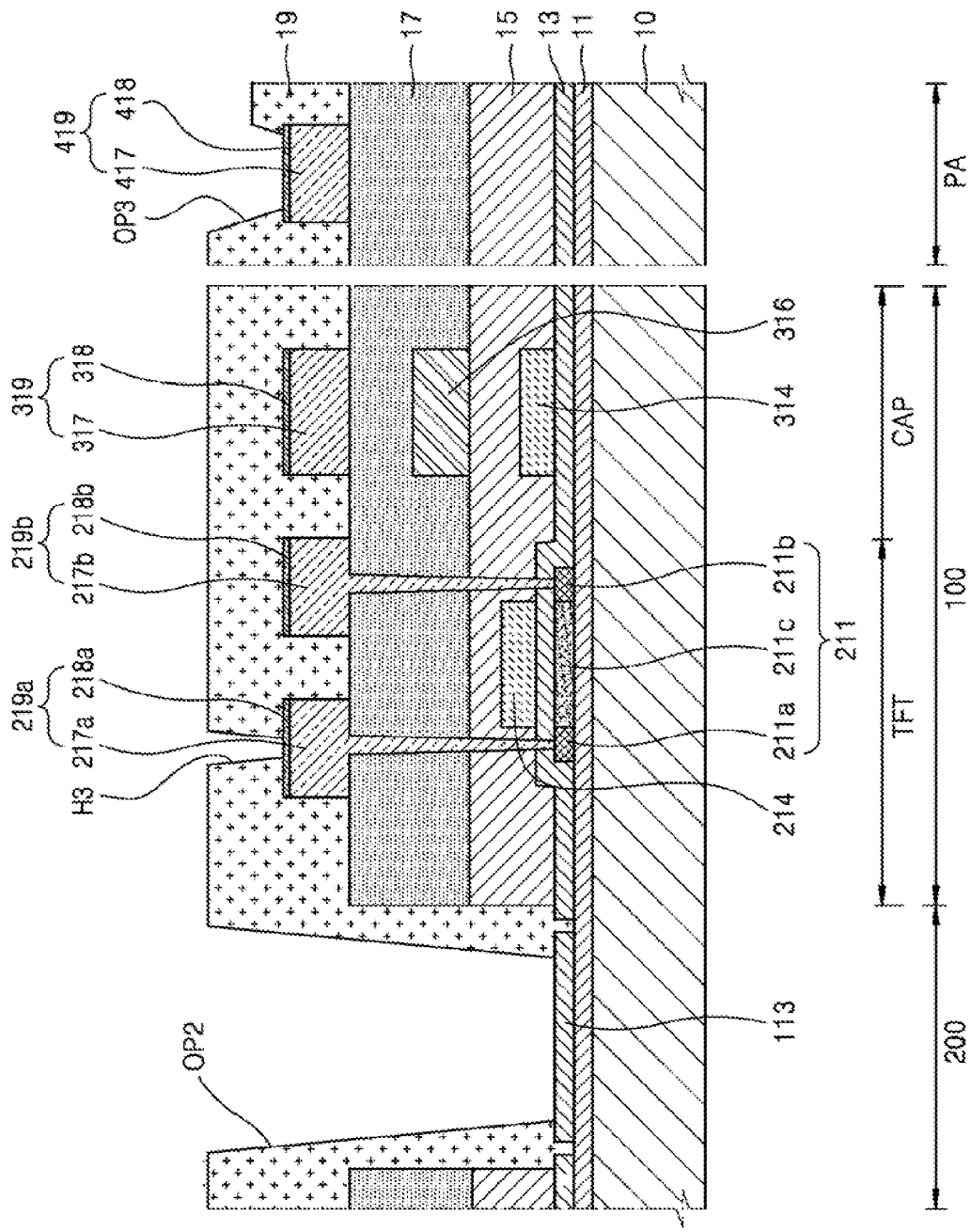

FIG. 12 is a cross-sectional view illustrating a sixth mask process. A fourth insulation layer 19 is formed on a resultant product of the fifth mask process of FIG. 11, and the fourth insulation layer 19 is patterned. Accordingly, a via hole H3 exposing a portion of the source electrode 219a of the thin film transistor TFT is formed in the fourth insulation layer 19. An opening OP2 exposing a portion of the inorganic insulation layer 113 of the second area 200 is also formed in the fourth insulation layer 19. An opening OP3 exposing a portion of the pad electrode 419 of the pad unit PA is also formed in the fourth insulation layer 19. For example, the fourth insulation layer 19 covers a pixel circuit unit including the thin film transistor TFT and the capacitor CAP of the first area 100, and includes the opening OP2 exposing at least a portion of the inorganic insulation layer 113 of the second area 200.

The fourth insulation layer 19 may include an organic insulation layer and may be a single layer or may include multiple layers. The fourth insulation layer 19 may include, for example, a commonly used polymer, such as PMMA or PS. The fourth insulation layer 19 may alternatively or additionally include a polymer derivative having a phenol group, an acrylic polymer, an imide-based polymer, an arylether-based polymer, an amide-based polymer, a fluorine-based polymer, a p-xylene-based polymer, a vinyl alcoholic polymer, and/or a blend thereof. For example, the fourth insulation layer 19 may include polyimide, polyamide, or an acrylic resin.

As the openings OP1 and OP2 are formed in the second area 200, light transmittance of the second area 200 may increase.

Figure 13:
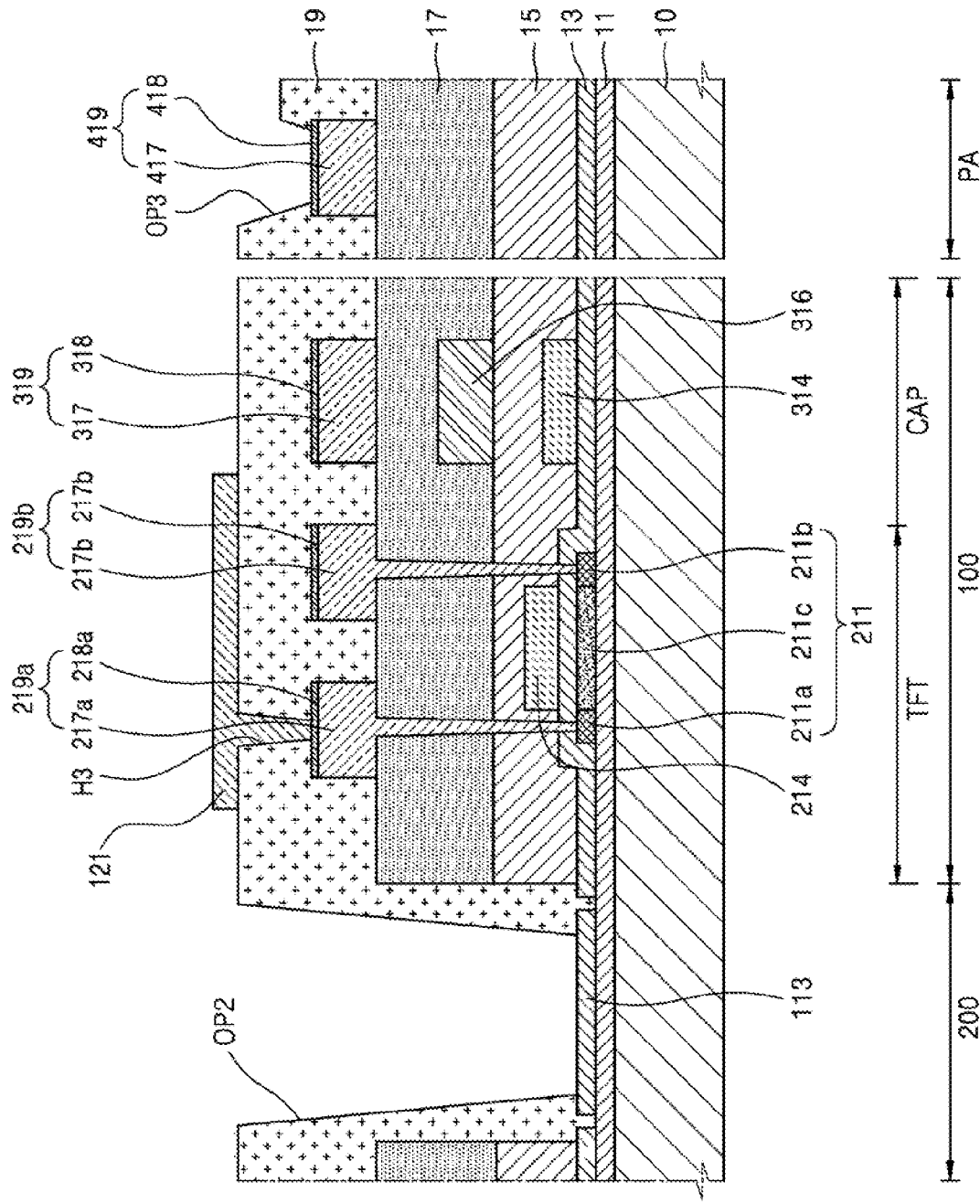

FIG. 13 is a cross-sectional view illustrating a seventh mask process. A fifth conductive layer is formed on a resultant product of the sixth mask process of FIG. 12. The fifth conductive layer is patterned to form a first electrode 121 of a light-emitting device EL in the first area 100. The first electrode 121 is electrically connected to the source electrode 219a through the via hole H3, and is disposed such that at least a portion of the first electrode 121 overlaps with the thin film transistor TFT and the capacitor CAP.

The fifth conductive layer may include a reflective layer including Ag, Mg, Al, Pt, Pd, Au, Ni, Nd, Ir, Cr or a compound thereof or the like and a transparent or semi-transparent electrode layer formed on the reflective layer.

Figure 14:
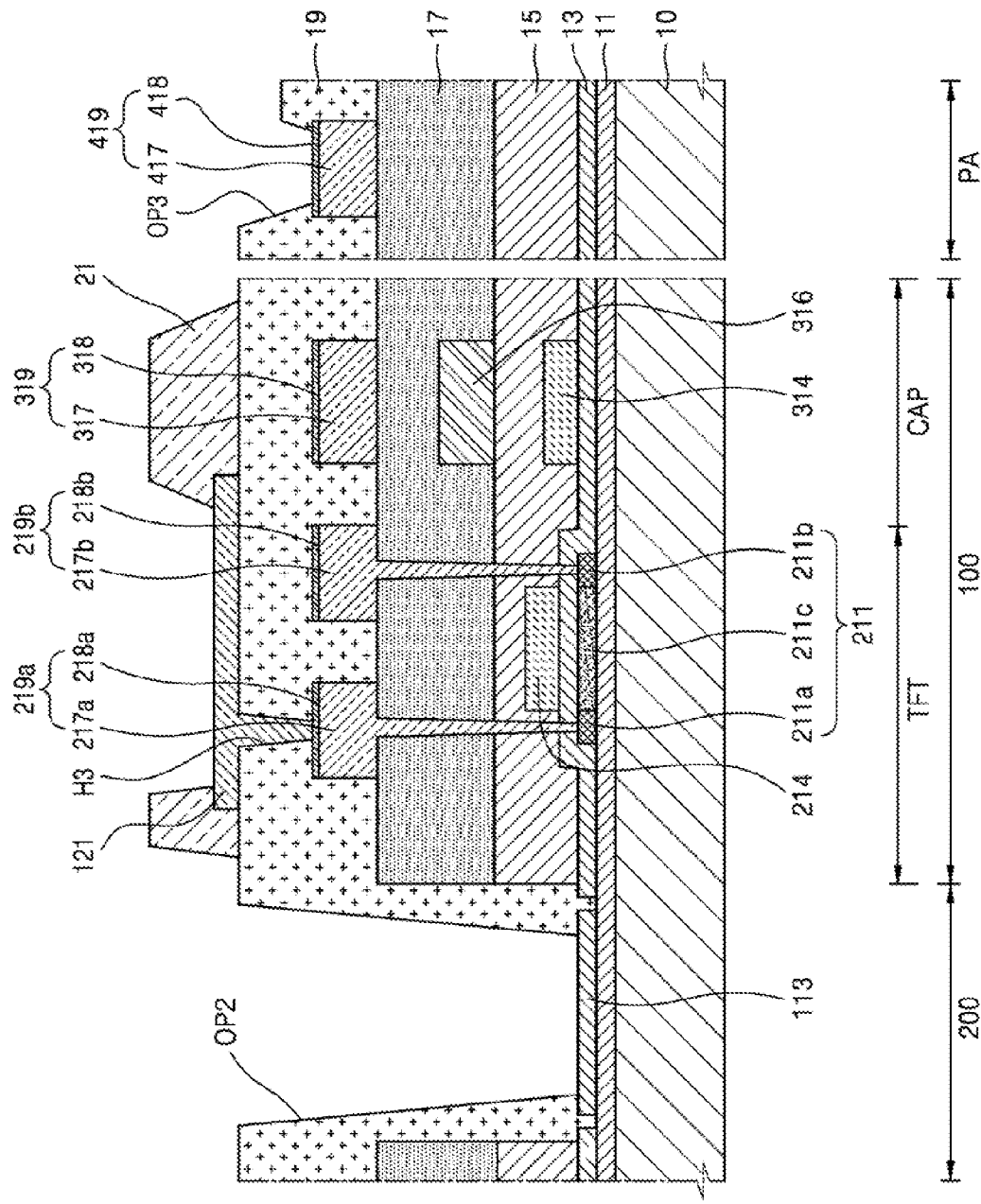

FIG. 14 is a cross-sectional view illustrating an eighth mask process. A fifth insulation layer is formed on a resultant product of the seventh mask process of FIG. 13, and the fifth insulation layer is patterned to form a pixel-defining layer 21 in the first area 100. The fifth insulation layer covers one or more edges of the first electrode 121 and is patterned into an island shape. Accordingly, the pixel-defining layer 21 covers the edges of the first electrode 121 in the first area 100 of each pixel and is formed on the fourth insulation layer 19 in a closed loop shape. The pixel-defining layer 21 is not formed within the opening OP2 of the fourth insulation layer 19 formed in the second area 200 but, rather, is formed outside the opening OP2. According to the approach illustrated in FIG. 14, an etching surface of the third insulation layer 19, in which the opening OP2 is formed, and an etching surface of the pixel-defining layer 21, near the opening OP2, do not correspond to each other. Rather, the pixel-defining layer 21 is disposed away from the opening OP2 in a direction towards the first electrode 121. However, the present invention is not limited to this particular arrangement, and a structure in which the pixel-defining layer 21 is not disposed within the opening OP2, for example, a structure in which an etching surface of the third insulation layer 19 in which the opening OP2 is formed and an etching surface of the pixel-defining layer 21 at the opening OP2 correspond to each other may also be included.

The fifth insulation layer may include an organic insulation layer and may be either a single layer or it may include multiple layers.

By disposing the pixel-defining layer 21 in only a portion of the first area 100 and not in the opening OP2 of the second area 200, outgassing of the pixel-defining layer 21, which includes an organic insulation material, may be reduced and an increase in a taper angle at a lateral surface of the second opening OP2 of the second area 200 may be prevented. When the taper angle is reduced, step coverage of the second area 200 is increased to thereby prevent cracks in the second electrode 125.

Next, the intermediate layer 123 (see FIG. 5) and the second electrode 125 (see FIG. 5) are formed on the substrate 10, and the substrate 10 may be encapsulated using an encapsulation member. A capping layer and a filling material may be provided between the substrate 10 and the encapsulation member.

Figure 15:
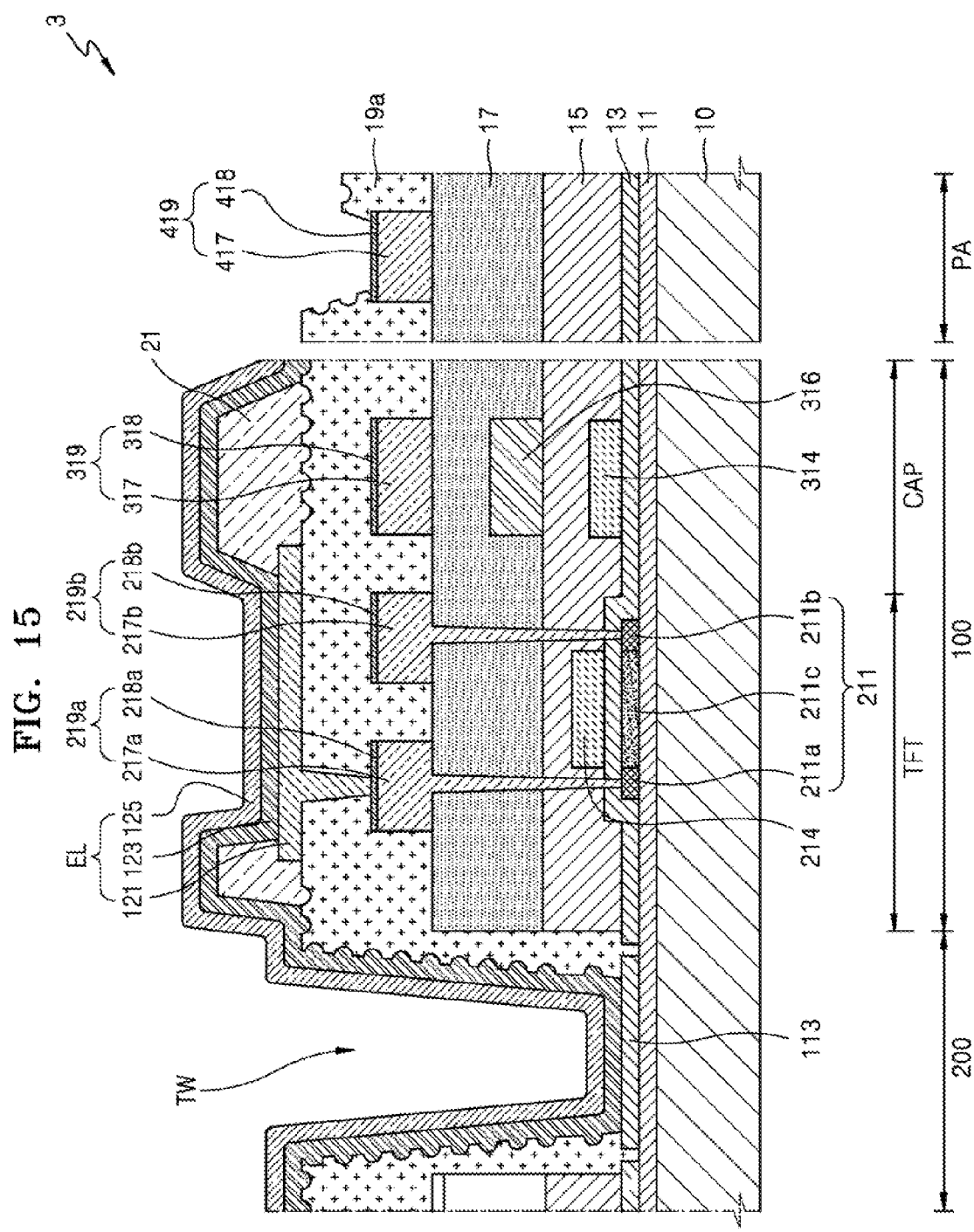
FIGS. 15 and 16 are cross-sectional views illustrating a portion of a pixel and a portion of a pad unit included in a display apparatus according to an exemplary embodiment of the inventive concept.
Figure 16:
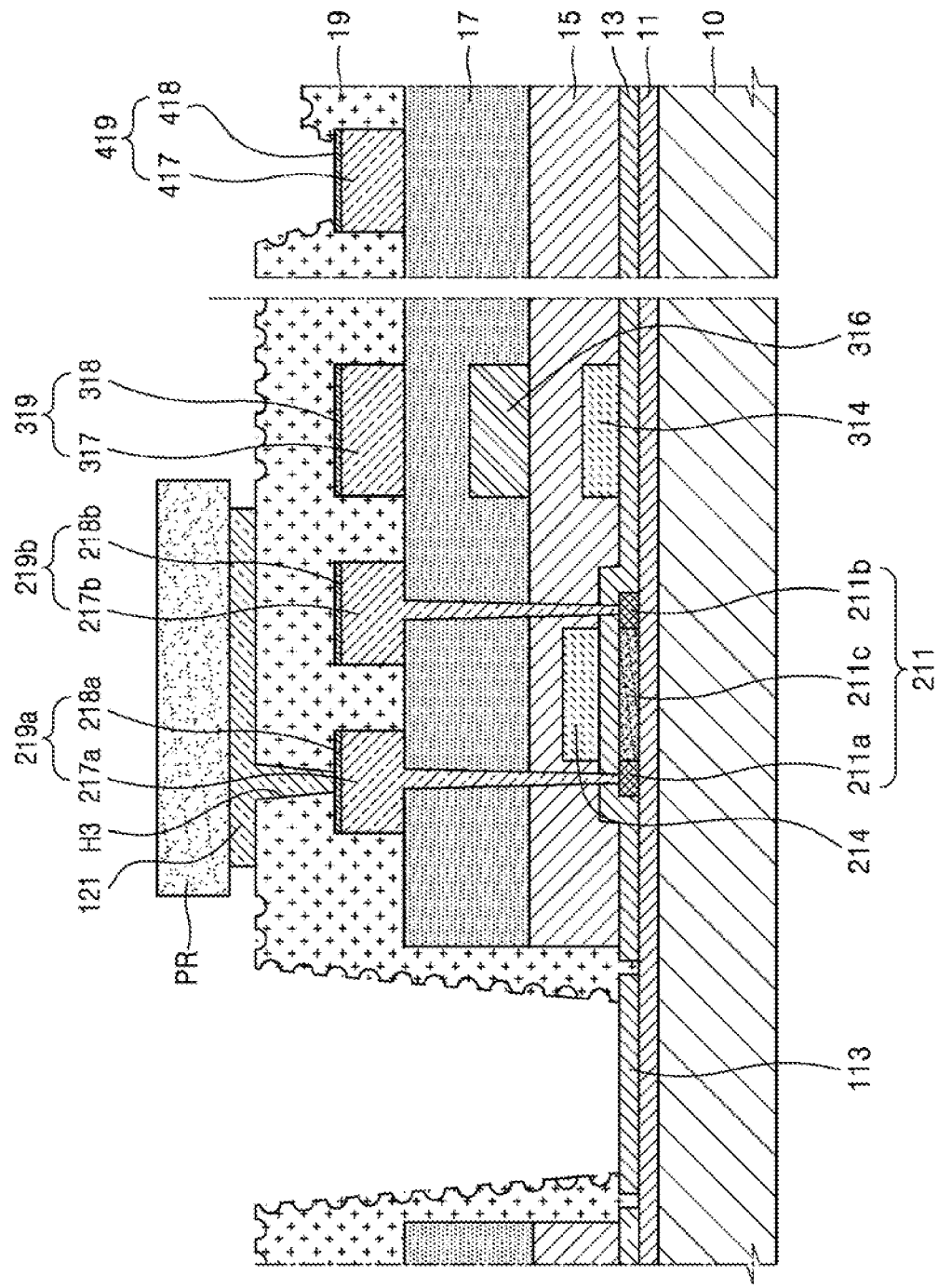

FIGS. 15 and 16 are cross-sectional views illustrating a portion of a pixel and a portion of a pad unit included in a display apparatus 3 according to an exemplary embodiment of the inventive concept. The display apparatus 3 may also include some or all of the features illustrated in FIGS. 1 through 3.

Referring to FIG. 15, according to an exemplary embodiment of the present invention, the display apparatus 3 may include a pixel PX that is disposed on a substrate 10. The pixel includes a first area 100 from which light is emitted and a second area 200 through which ambient light is transmitted.

A fourth insulation layer 19a covers a pixel circuit unit including a thin film transistor TFT and a capacitor CAP in the first area 100, and covers edges of the inorganic insulation layer 113 in the second area 200. For example, the fourth insulation layer 19a includes an opening exposing a portion of the inorganic insulation layer 113 in the second area 200. The fourth insulation layer 19a covers one or more edges of the second pad electrode 418 of the pad unit PA.

A concave-convex pattern is formed on an upper surface of the fourth insulation layer 19a. The concave-convex pattern may be formed using any suitable technique. For example, a concave-convex pattern may be formed in the fourth insulation layer 19a by using an ashing operation before removing a photoresist PR remaining on the first electrode 121, when forming the first electrode 121 in the seventh mask process of FIG. 13. The concave-convex pattern may include concave grooves, and the grooves may have a circular shape, a square shape, or another shape.

In the second area 200, by forming the concave-convex pattern in the fourth insulation layer 19a, a distance along which foreign substances may penetrate from the second area 200 into the organic emissive layer of the first area 100, due to cracks generated in the second electrode 125, increases, and thus penetration of the foreign substances may be minimized or prevented. This may be true even when step coverage of the second area is poor.

Elements of FIGS. 15 and 16 that have not been described in detail above may be assumed to be similar or identical to corresponding elements of the display apparatus 2 of FIG. 5, and thus description thereof will not be repeated.

Figure 17:
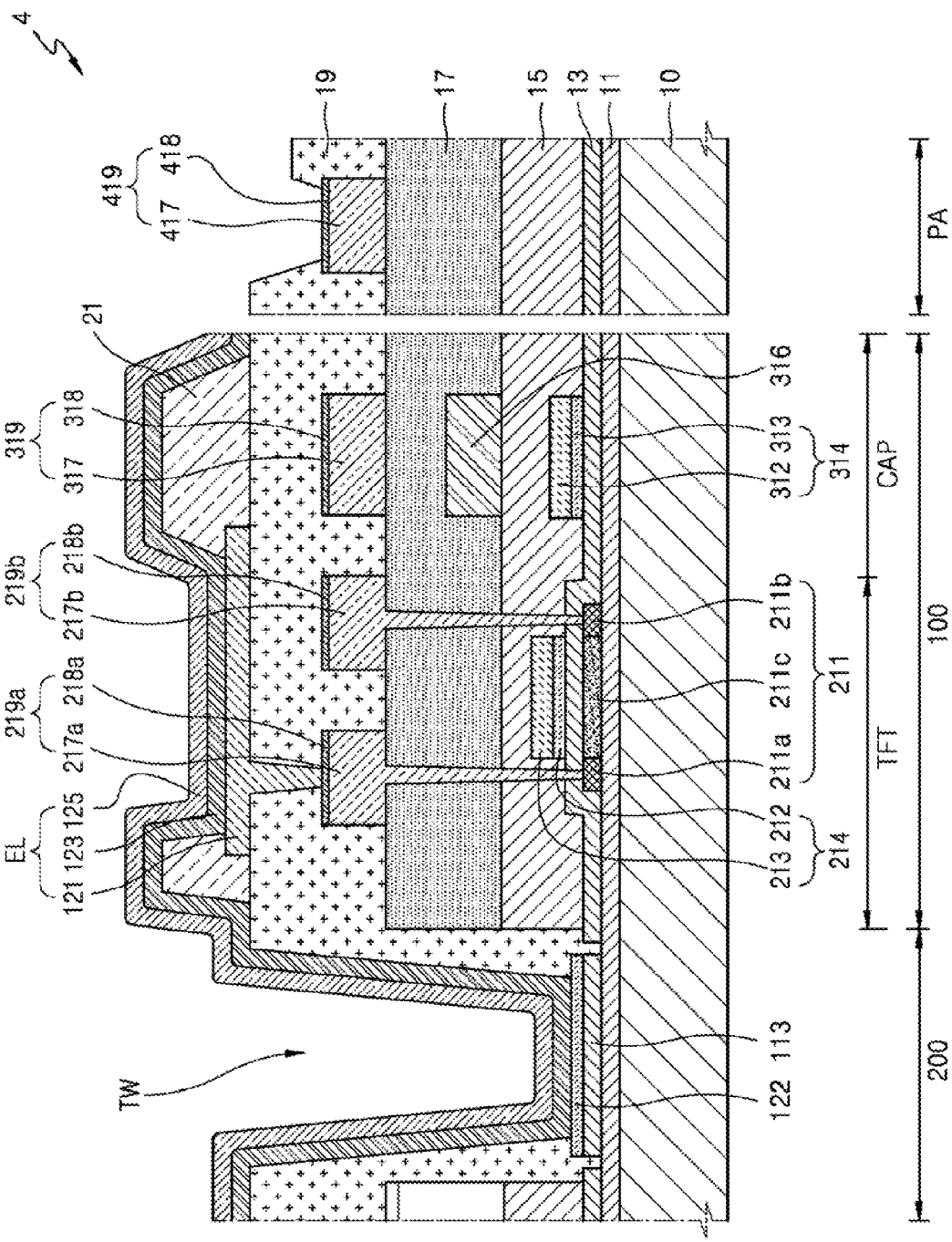
FIG. 17 is a cross-sectional view illustrating a portion of a pixel and a portion of a pad unit of a display apparatus according to an exemplary embodiment of the inventive concept.

FIG. 17 is a cross-sectional view illustrating a portion of a pixel and a portion of a pad unit of a display apparatus 4 according to an exemplary embodiment of the inventive concept. The display apparatus 4 of FIG. 17 may share one or more elements in common with the approach illustrated in FIGS. 1 through 3.

Referring to FIG. 17, the display apparatus 4, according to an exemplary embodiment of the present invention, may include a pixel PX that is disposed on a substrate 10. The pixel PX may include a first area 100 from which light is emitted and a second areas 200 through which ambient light is transmitted.

In the first area 100, a pixel circuit unit, including at least one thin film transistor TFT and at least one capacitor CAP, is disposed on a buffer layer 11. A light-emitting device EL is also included in the pixel circuit unit of the first area 100. The thin film transistor TFT includes an active layer 211, a gate electrode 214 that is insulated from the active layer 211, a source electrode 219a, and a drain electrode 219b. The source electrode 219a and the drain electrode 219b are electrically connected to the active layer 211. The gate electrode 214 includes a first gate electrode 212 and a second gate electrode 213. The source electrode 219a includes a first source electrode 217a and a second source electrode 218a. The drain electrode 219b includes a first drain electrode 217b and a second drain electrode 218b. The capacitor CAP includes a first capacitor electrode 314, a second capacitor electrode 316, and a third capacitor electrode 319. The first capacitor electrode 314 includes a first capacitor bottom electrode 312 and a first capacitor top electrode 313.

The third capacitor electrode 319 includes a third capacitor bottom electrode 317 and a third capacitor top electrode 318.

An inorganic insulation layer 113 is disposed on the buffer layer 11 in the second area 200, and a transparent conductive layer 122 may be disposed on the inorganic insulation layer 113.

The transparent conductive layer 122 covers the entire upper surface of the inorganic insulation layer 113, and may function as an anti-etching layer that prevents the inorganic insulation layer 113 from being etched during an etching operation of removing the second insulation layer 15 and the third insulation layer 17 formed in the second area 200. The transparent conductive layer 122 may include a transparent conductive material.

Edge areas of the inorganic insulation layer 113 and the transparent conductive layer 122 may be covered by the fourth insulation layer 19 extending from the first area 100. The edge areas of the transparent conductive layer 122 covered by the fourth insulation layer 19, which is an organic insulation layer, may be disposed between the fourth insulation layer 19 and the inorganic insulation layer 113. The transparent conductive layer 122 disposed between the inorganic insulation layer 113 and the fourth insulation layer 19 may increase adhesive forces between layers to thereby prevent a detachment of the fourth insulation layer 19. Accordingly, step coverage of the second area 200 may be further increased to prevent cracks in the second electrode 125, and as a result, penetration of foreign substances into an organic emissive layer may also be prevented.

Other elements of FIG. 17 that were not discussed may be assumed to be similar or identical to corresponding elements that were discussed above with respect to the display apparatus 2 of FIG. 5, and thus description thereof will not be repeated.

FIGS. 18 through 25 are cross-sectional views illustrating a method of manufacturing a display apparatus according to an exemplary embodiment of the present invention. Description of elements and features discussed above with reference to FIGS. 7 through 14 will not be repeated below.

Figure 18:
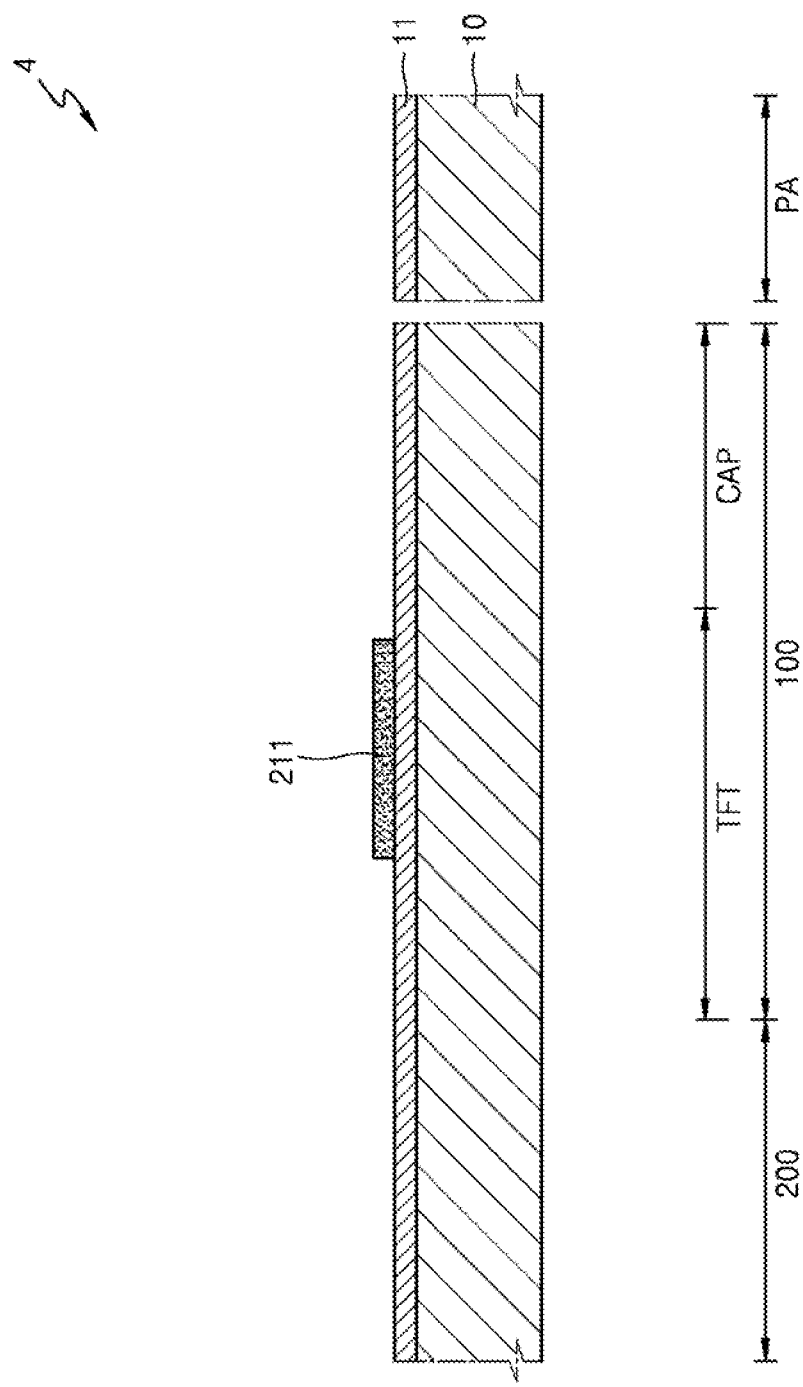
FIGS. 18 through 25 are cross-sectional views illustrating a method of manufacturing a display apparatus according to an exemplary embodiment of the inventive concept.

FIG. 18 is a cross-sectional view illustrating a first mask process. A buffer layer 11 is disposed on a substrate 10, and a semiconductor layer is formed on the buffer layer 11. The semiconductor layer is then patterned to form an active layer 211 of a thin film transistor TFT.

Figure 19:
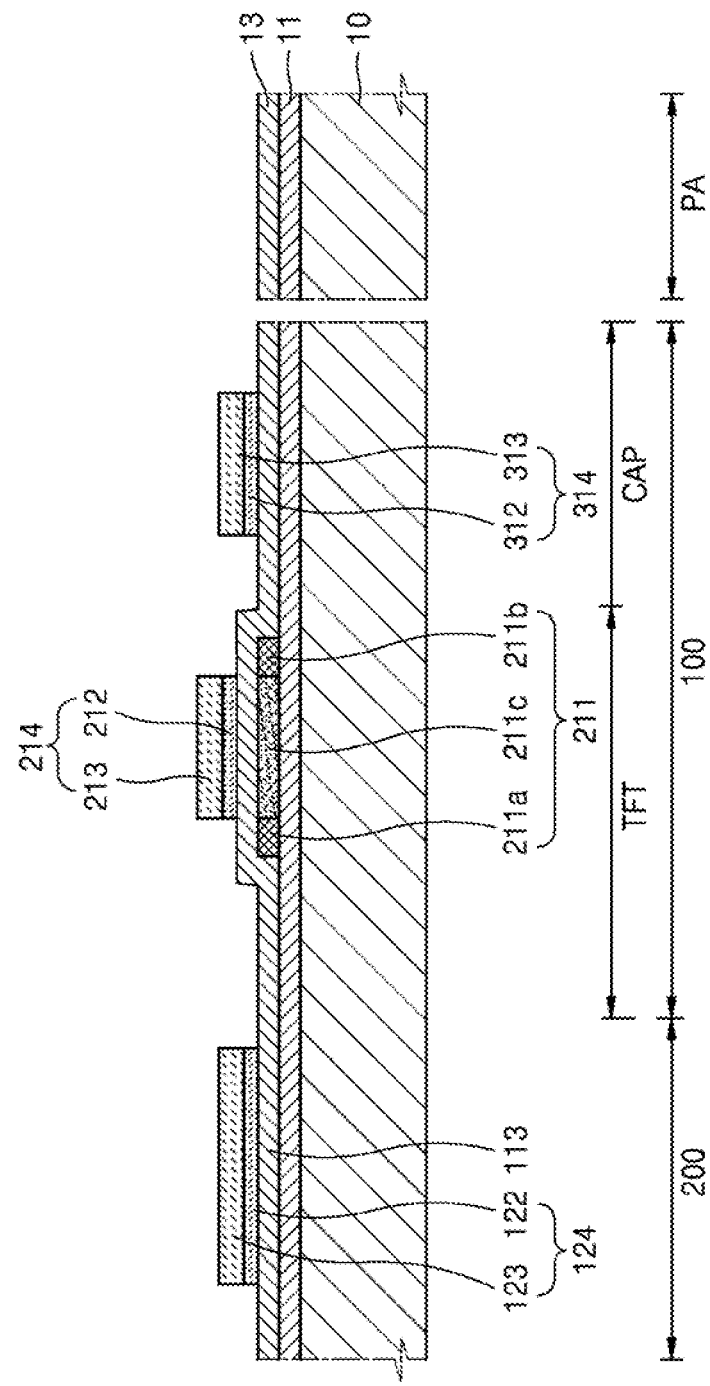

FIG. 19 is a cross-sectional view illustrating a second mask process. A first insulation layer 13 is formed on a resultant product of the first mask process of FIG. 18. A first conductive layer and a second conductive layer are continuously formed on the first insulation layer 13 and are then patterned. Accordingly, a gate electrode 214 of the thin film transistor TFT and a first capacitor electrode 314 of a capacitor CAP are formed in the first area 100, and a metal pattern 124 is formed in the second area 200.

The gate electrode 214 includes a first gate electrode 212 formed of a portion of the first conductive layer and a second gate electrode 213 formed of a portion of the second conductive layer. The first capacitor electrode 314 includes a first capacitor bottom electrode 312 formed of a portion of the first conductive layer and a first capacitor top electrode 313 formed of a portion of the second conductive layer. The metal pattern 124 includes a lower metal 122 formed of a portion of the first conductive layer and an upper metal 123 formed of a portion of the second conductive layer.

The first insulation layer 13 may include an inorganic insulation layer and may be a single layer or may include multiple layers.

The structure of the second mask process of FIG. 19 is doped with B or P ion impurities. Accordingly, the active layer 211 includes a source area 211a and a drain area 211b doped with ion impurities and a channel area 211c between the source and drain areas 211a and 211b.

The first conductive layer may include a transparent conductive oxide including an indium tin oxide (ITO), an indium zinc oxide (IZO), a zinc oxide (ZnO), an indium oxide ($In_2O_3$), an indium gallium oxide (IGO), and/or an aluminum zinc oxide (AZO).

The second conductive layer may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) either as a single layer or within multiple layers. The second conductive layer may include three layers of, for example, a Mo/Al/Mo structure or a Ti/Al/Ti structure.

Figure 20:
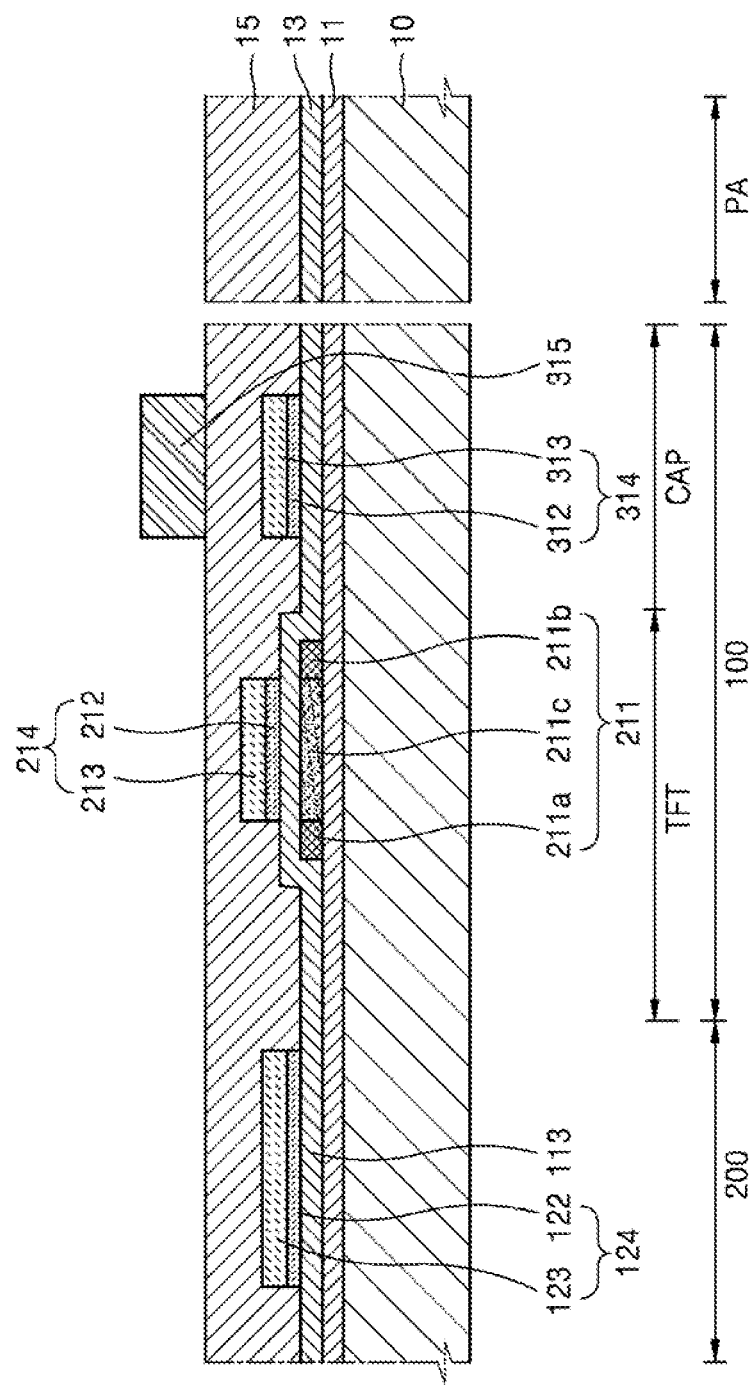

FIG. 20 is a cross-sectional view illustrating a third mask process. A second insulation layer 15 is formed on a resultant product of the second mask process of FIG. 19. A third conductive layer is formed on the second insulation layer 15 and is then patterned. Accordingly, a second capacitor electrode 316 of the capacitor CAP is formed in the first area 100.

The second insulation layer 15 may include an inorganic insulation layer either as a single layer or as multiple layers.

The third conductive layer may include a same material as that of the second conductive layer and the third conductive layer may also have either a single layer structure or a multiple layer structure.

Figure 21:
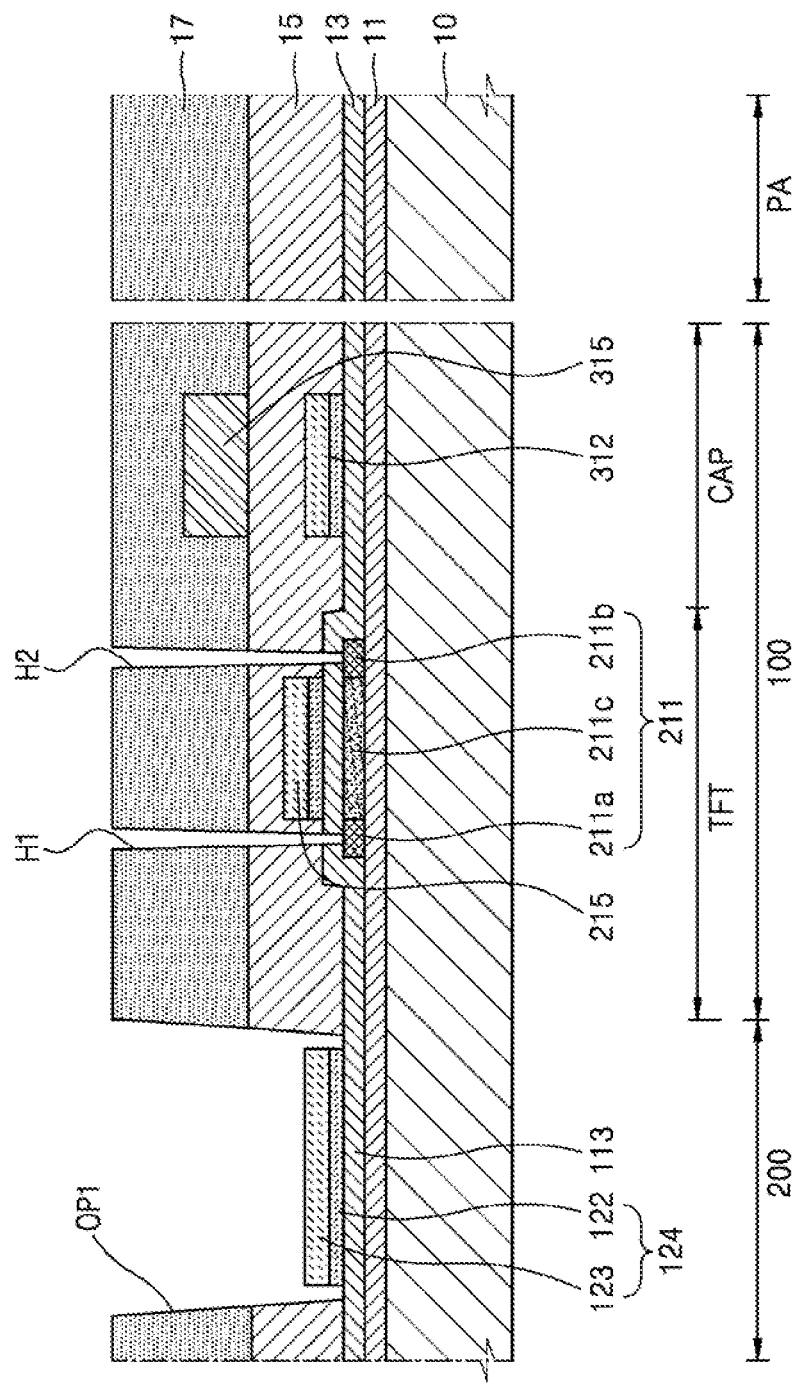

FIG. 21 is a cross-sectional view illustrating a fourth mask process. A third insulation layer 17 is formed on a resultant product of the third mask process of FIG. 20. The first insulation layer 13, the second insulation layer 15, and the third insulation layer 17 are then patterned. Accordingly, contact holes H1 and H2 are formed in the first insulation layer 13, the second insulation layer 15, and the third insulation layer 17 to expose portions of the source area 211a and the drain area 211b of the active layer 211 in the first area 100. An opening OP1 is formed in the second area 200 to expose the metal pattern 124. The second area 200 is spaced apart from a side of the active layer 211.

The third insulation layer 17 may include an inorganic insulation layer and the third insulation layer 17 may include either a single layer or multiple layers.

Figure 22:
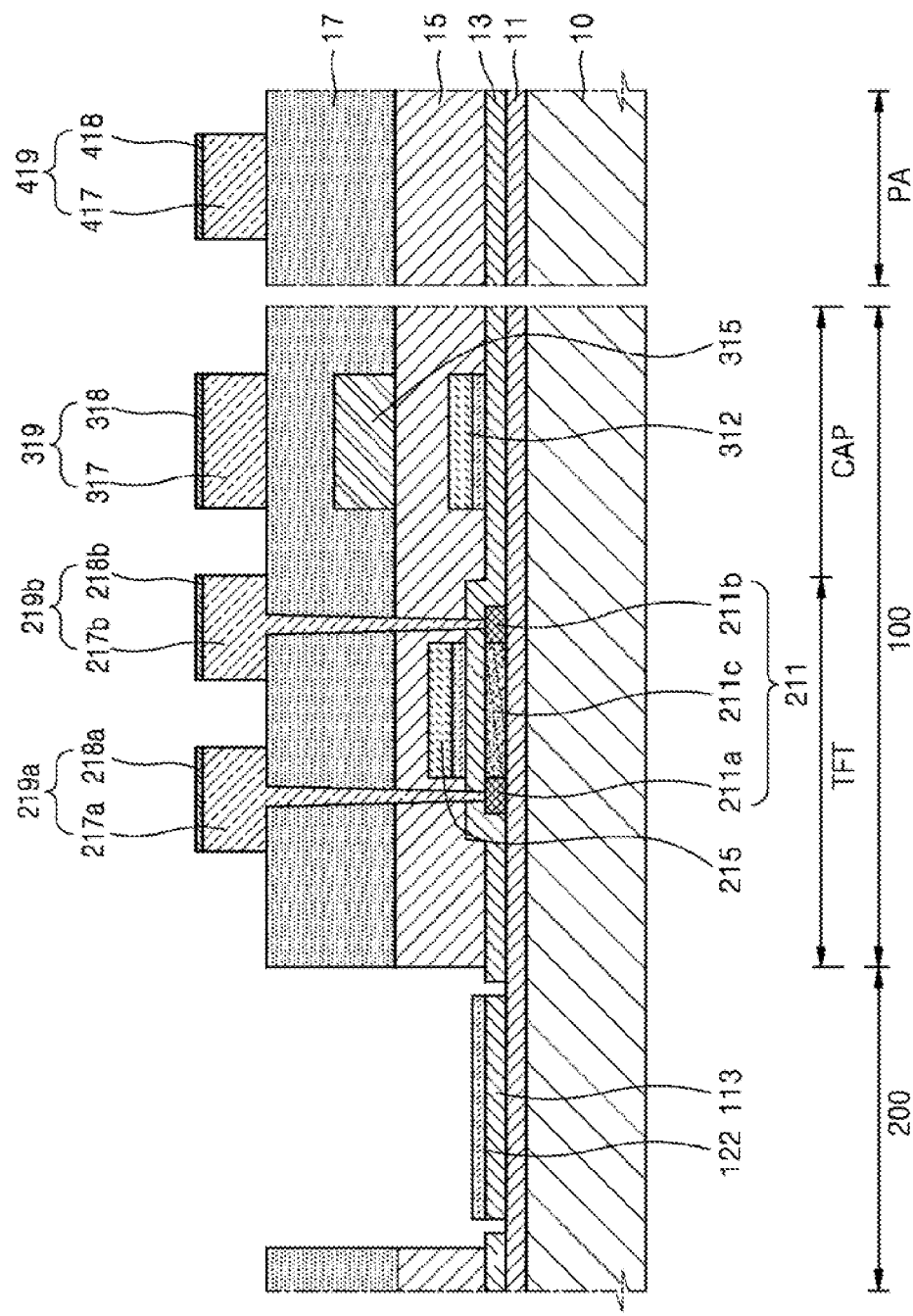

FIG. 22 is a cross-sectional view illustrating a fifth mask process. A fourth conductive layer and a fifth conductive layer are continuously formed on a resultant product of the fourth mask process of FIG. 21. The fourth and fifth conductive layers are simultaneously patterned. Accordingly, a source electrode 219a and a drain electrode 219b of the thin film transistor TFT and a third capacitor electrode 319 of the capacitor CAP are formed in the first area 100. In the second area 200, the upper metal 123 of the metal pattern 124 is removed, and only the lower metal 122 remains. The lower metal 122 is formed to a transparent conductive layer 122 and the first insulation layer 13 under the transparent conductive layer 122 is patterned to form an inorganic insulation layer 113. While the first insulation layer 13 is patterned to form the inorganic insulation layer 113 in FIG. 22, the instant invention is not limited to this particular configuration. Without patterning the first insulation layer 13, a portion of the first insulation layer 13 disposed in the second area 200 may function as the inorganic insulation layer 113. A pad electrode 419 is disposed in the pad unit PA.

The fourth conductive layer may include a same material as that of the second conductive layer. The fourth conductive layer may include either a single layer or multiple layers. The fifth conductive layer may include a transparent conductive oxide that is at least similar to the first conductive layer.

The second source electrode 218a, the second drain electrode 218b, the third capacitor top electrode 318, and the second pad electrode 418 may respectively function as protection layers of the first source electrode 217a, the first drain electrode 217b, the third capacitor bottom electrode 317, and the first pad electrode 417.

Figure 23:
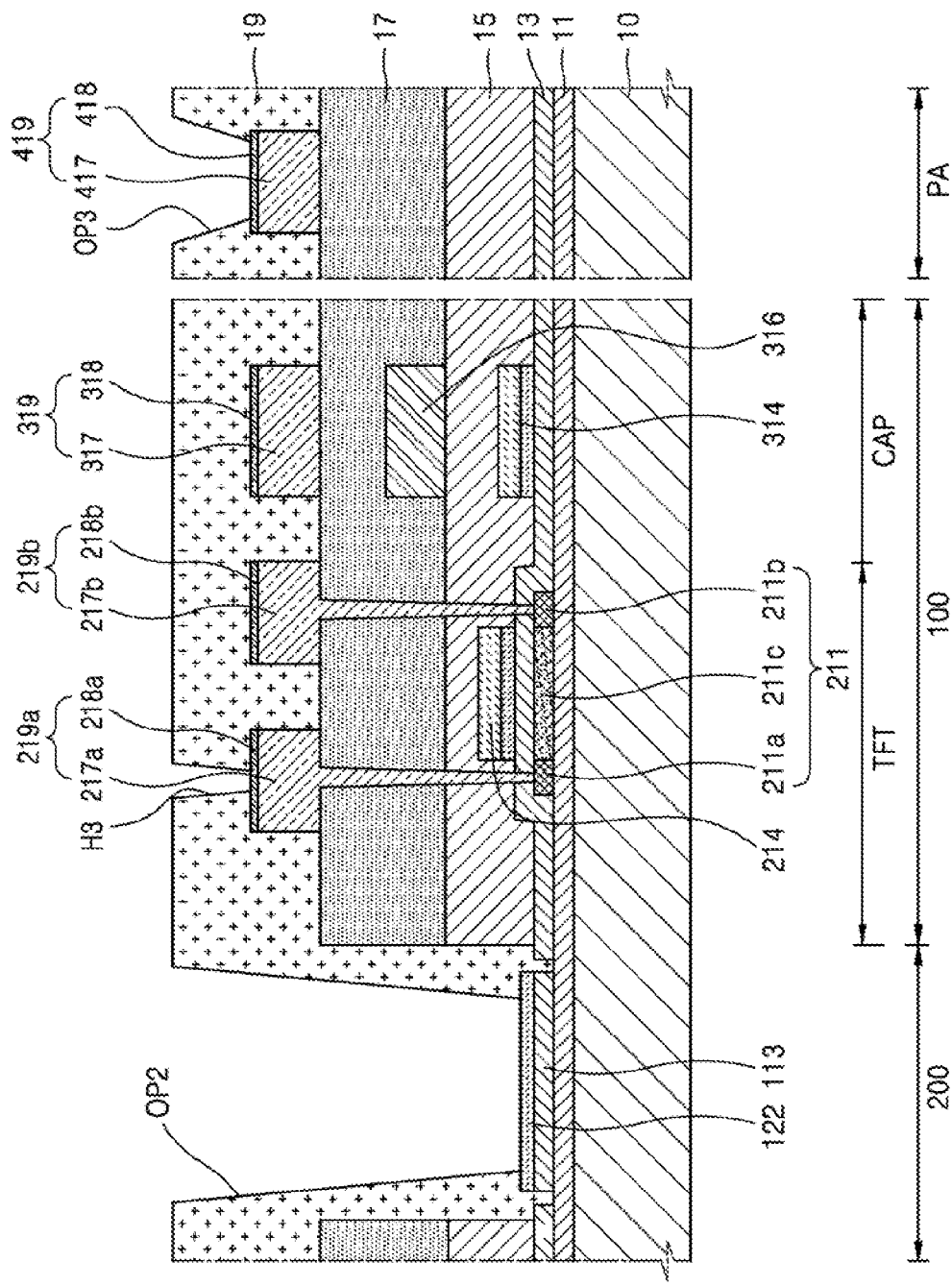

FIG. 23 is a cross-sectional view illustrating a sixth mask process. A fourth insulation layer 19 is formed on a resultant product of the fifth mask process of FIG. 22. The fourth insulation layer 19 is then patterned. Accordingly, a via hole H3 exposing a portion of the source electrode 219a of the thin film transistor TFT, an opening OP2 exposing the transparent conductive layer 122 of the second area 200, and an opening OP3 exposing the pad electrode 419 of the pad unit PA are formed in the fourth insulation layer 19.

The fourth insulation layer 19 may include an organic insulation layer and may have either a single layer or multiple layers.

By forming the openings OP1 and OP2 in the second area 200, light transmittance of the second area 200 may increase.

Figure 24:
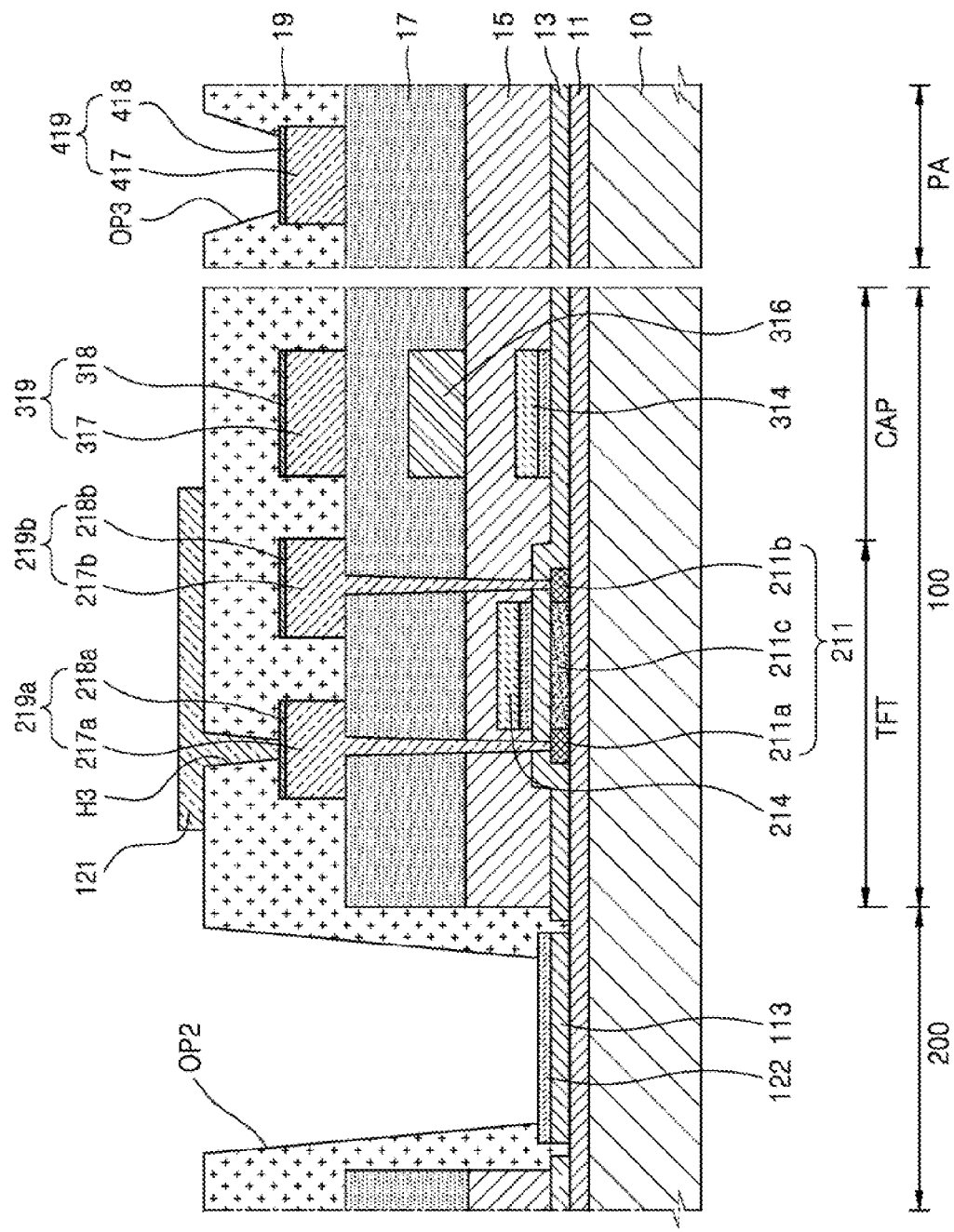

FIG. 24 is a cross-sectional view illustrating a seventh mask process. A sixth conductive layer is formed on a resultant product of the sixth mask process of FIG. 23. The sixth conductive layer is patterned to form a first electrode 121 of a light-emitting device EL in the first area 100. The first electrode 121 is electrically connected to the source electrode 219a via the via hole H3. At least a portion of the first electrode 121 overlaps the thin film transistor TFT and the capacitor CAP.

The sixth conductive layer may include a reflective layer including Ag, Mg, Al, Pt, Pd, Au, Ni, Nd, Ir, Cr, or a compound of these or the like and a transparent or semi-transparent electrode layer may be formed on the reflective layer.

Figure 25:
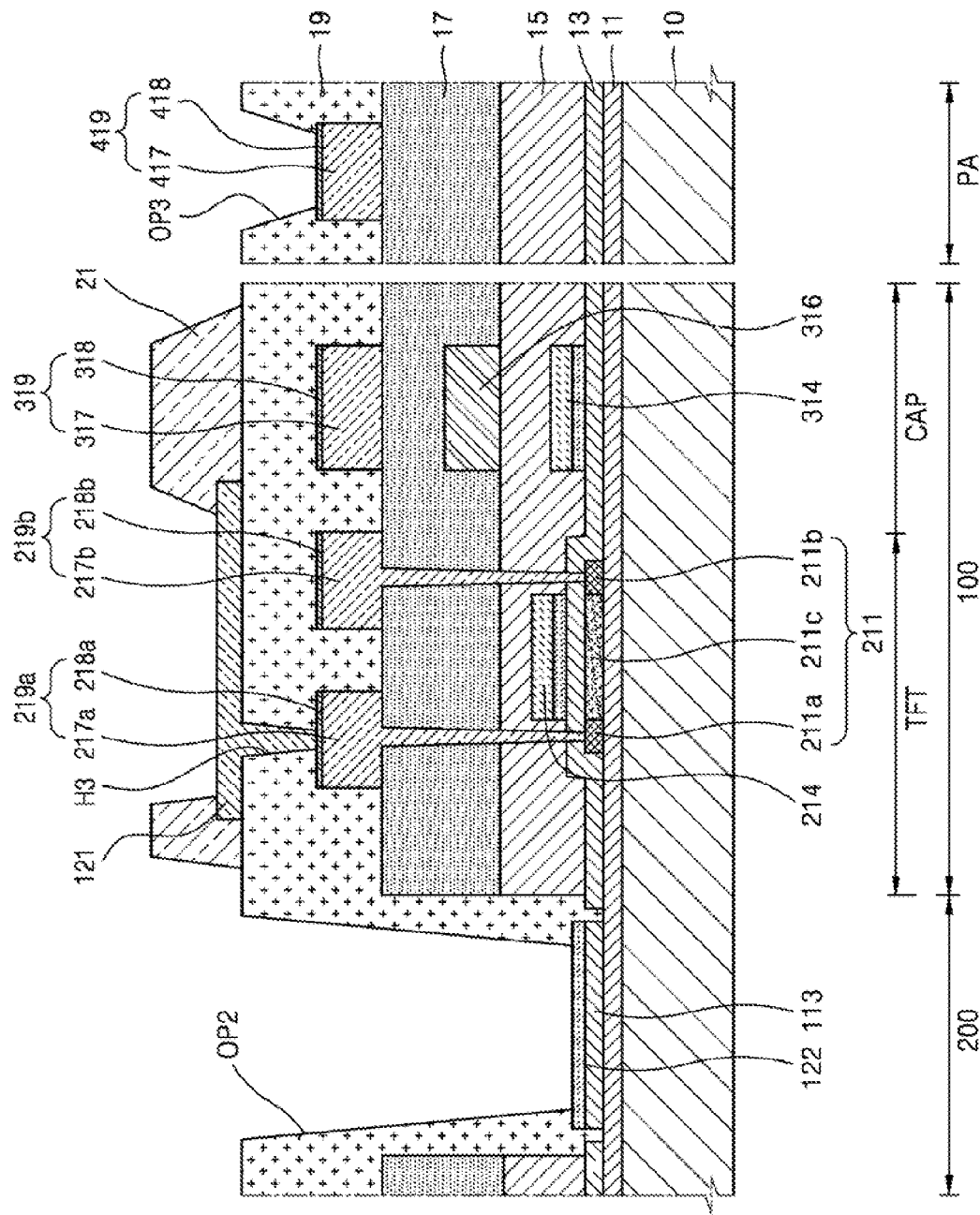

FIG. 25 is a cross-sectional view illustrating an eighth mask process. A fifth insulation layer is formed on a resultant product of the seventh mask process of FIG. 24. The fifth insulation layer is patterned to form a pixel-defining layer 21 in the first area 100. The pixel-defining layer 21 covers one or more edges of the first electrode 121.

Similar to the fourth insulation layer 19, the fifth insulation layer may include an organic insulation layer and may have either a single layer or multiple layers.

By disposing the pixel-defining layer 21 exclusively in a portion of the first area 100 and not inside the opening OP2 of the second area 200, outgassing of the pixel-defining layer 21 including an organic insulation material, may be reduced, and an increase in a taper angle at a lateral surface of the second opening OP2 of the second area 200 may be prevented. When the taper angle is reduced, step coverage of the second area 200 is increased, and thus cracks in the second electrode 125 may be prevented.

Next, the intermediate layer 123 (see FIG. 17) and the second electrode 125 (see FIG. 17) are formed on the substrate 10. The substrate 10 may then be encapsulated using an encapsulation member. A capping layer and a filling material may be provided between the substrate 10 and the encapsulation member.

According to an exemplary embodiment of the present invention, the pixel PX includes the second area 200 through which external light is transmitted. The second area 200 is formed at a side of the first area 100, in which the light emitting device emitting light is disposed. Accordingly, a see-through display apparatus may be implemented.

According to an exemplary embodiment of the present invention, in a display apparatus, a pixel-defining layer of a pixel PX is disposed exclusively in a portion of the first area 100. The pixel-defining layer is not disposed at edges of an inorganic insulation layer in the second area 200. Thus, step coverage of the second area 200 may be increased to thereby prevent a detachment of the organic insulation layer and cracks in a second electrode in the second area 200.

In addition, according to an exemplary embodiment of the present invention, in a display apparatus, a concave-convex pattern is formed on an upper surface of an organic insulation layer within the second area 200 of the pixel PX. For example, the concave-convex pattern may be formed on an upper surface of an organic insulation layer covering an inorganic insulation layer of the second area 200. Accordingly, even when cracks are generated in a second electrode of the second area 200, due to poor step coverage of the second area 200, a distance along which foreign substances (e.g., a filling material) penetrate into an emissive layer of the first area 100 through the cracks generated in the second electrode may increase. By increasing this distance, less foreign substances are likely to contaminate the organic emissive layer.

In addition, according to an exemplary embodiment of the present invention, as a transparent conductive layer is disposed on an inorganic insulation layer in the second area 200, an adhesive force between the inorganic insulation layer and an organic insulation layer may be increased. A see-through display apparatus having an increased transmittance may be implemented thereby.

Although a top gate type thin film transistor TFT in which a gate electrode is formed on an active layer is described with reference to the above-described exemplary embodiments, the present invention is not limited to this particular configuration, and a gate electrode may also be disposed under an active layer.

According to exemplary embodiments of the inventive concept, a transparent display apparatus having increased light transmittance may be implemented.

It should be understood that exemplary embodiments described herein should be considered in a descriptive sense only and should not be understood as limiting the present invention to the described features.

While one or more exemplary embodiments of the present invention have been described herein with reference to the figures, it will be understood by those of ordinary skill in the art that various changes in form and details may be made therein without departing from the spirit and scope of the present disclosure.

What is claimed is:

1. A display apparatus comprising:
  a substrate;
  a buffer layer disposed on the substrate;
  a pixel disposed on the buffer layer and including a first area, from which light is emitted, and a second area that does not intersect the first area, through which ambient light is transmitted, the buffer layer extending through both the first area and the second area of the pixel;
  a pixel circuit unit disposed in the first area of the pixel and including at least one thin film transistor;
  an inorganic insulation layer disposed on the buffer layer, exclusively in the second area of the pixel;

a first insulation layer covering the pixel circuit unit in the first area, and having an opening exposing at least a portion of the inorganic insulation layer in the second area;
a first electrode disposed on the first insulation layer in the first area, wherein the first electrode is electrically connected to the pixel circuit unit;
a second insulation layer covering one or more edges of the first electrode, and the second insulation layer being disposed outside of the opening formed in the first insulation layer;
a second electrode disposed in the first area; and
an intermediate layer disposed between the first electrode and the second electrode, the intermediate layer including an emissive layer,
wherein the buffer layer is between the substrate and the inorganic insulation layer in the second area of the pixel.

2. The display apparatus of claim 1, wherein the first insulation layer comprises an organic insulation layer.

3. The display apparatus of claim 1, wherein the second insulation layer comprises an organic insulation layer.

4. The display apparatus of claim 1, wherein the second insulation layer has a shape of a closed loop as it covers the one or more edges of the first electrode.

5. The display apparatus of claim 1, wherein a concave or convex pattern is formed on an upper surface of the first insulation layer.

6. The display apparatus of claim 1, wherein at least a portion of the pixel circuit unit overlaps the first electrode.

7. The display apparatus of claim 1, wherein the inorganic insulation layer has a single layer structure or a double layer structure and the inorganic insulation layer includes silicon dioxide ($SiO_2$) and/or silicon nitride ($SiN_x$).

8. The display apparatus of claim 1, wherein the thin film transistor comprises:
an active layer;
a gate electrode disposed on the active layer and insulated from the active layer;
a third insulation layer disposed between the active layer and the gate electrode;
a plurality of fourth insulation layers disposed on the gate electrode;
a source electrode disposed on the plurality of fourth insulation layers and electrically connected to the active layer; and
a drain electrode disposed on the plurality of fourth insulation layers and electrically connected to the active layer,
wherein the plurality of fourth insulation layers cover end portions of the inorganic insulation layer within the second area of the pixel and does not cover a middle portion of the inorganic insulation layer that is between the end portions thereof.

9. The display apparatus of claim 8, wherein each of the source electrode and the drain electrode comprise:
a bottom electrode, comprising a first conductive material; and
a top electrode, comprising a second conductive material.

10. The display apparatus of claim 9, wherein the second conductive material comprises a transparent conductive material.

11. The display apparatus of claim 8, wherein the third insulation layer and the inorganic insulation layer comprises a same material.

12. The display apparatus of claim 8, further comprising a capacitor including:

a first capacitor electrode disposed on a same layer as the gate electrode;
a second capacitor electrode disposed between the insulation layers of the plurality of fourth insulation layers; and
a third capacitor electrode disposed on a same layer as the source electrode and the drain electrode.

13. The display apparatus of claim 1, further comprising a transparent conductive layer disposed on at least a portion of the inorganic insulation layer.

14. The display apparatus of claim 13, wherein the first insulation layer covers at least a portion of the transparent conductive layer.

15. The display apparatus of claim 13, wherein the transparent conductive layer covers an entirety of an upper surface of the inorganic insulation layer.

16. The display apparatus of claim 13, wherein the thin film transistor comprises:
an active layer;
a gate electrode disposed on the active layer and insulated from the active layer;
a third insulation layer disposed between the active layer and the gate electrode;
a plurality of fourth insulation layers disposed on the gate electrode;
a source electrode disposed on the plurality of fourth insulation layers and electrically connected to the active layer; and
a drain electrode disposed on the plurality of fourth insulation layers and electrically connected to the active layer.

17. The display apparatus of claim 16, further comprising a capacitor including:
a first capacitor electrode disposed on a same layer as the gate electrode;
a second capacitor electrode disposed between insulation layers of the plurality of fourth insulation layers; and
a third capacitor electrode disposed on a same layer as the source electrode and the drain electrode.

18. The display apparatus of claim 17, wherein each of the gate electrode and the first capacitor electrode comprises: a bottom electrode, comprising a first conductive material; and a top electrode, comprising a second conductive material.

19. The display apparatus of claim 18, wherein the first conductive material and the transparent conductive layer comprise a same material.

20. The display apparatus of claim 16, wherein the third insulation layer comprises a same material as the inorganic insulation layer.

21. A display apparatus comprising:
a substrate;
a buffer layer disposed on the substrate;
a pixel disposed on the buffer layer and including a first area, from which light is emitted, and a second area that does not intersect the first area, through which ambient light is transmitted, the buffer layer extending through both the first area and the second area of the pixel;
a pixel circuit unit disposed in the first area of the pixel and including at least one thin film transistor;
an inorganic insulation layer disposed on the buffer layer, exclusively in the second area of the pixel;
a transparent conductive layer disposed over the pixel circuit in the first area of the pixel and the inorganic insulation layer in the second area of the pixel; and
an organic insulating layer disposed between the transparent conductive layer and the pixel circuit, in the first area of the pixel, and covering end portions of the inorganic insulation layer, in the second area of the pixel, wherein the buffer layer is between the substrate and the inorganic insulation layer in the second area of the pixel.

22. The display apparatus of claim 21, wherein the transparent conductive layer directly contacts the inorganic insulation layer within an area between the end portions of the inorganic insulation layer that are covered by the organic insulating layer.

23. The display apparatus of claim 21, wherein the pixel is a light-emissive pixel that emits light from within the first area thereof.

* * * * *